United States Patent [19]

Sumita et al.

[11] Patent Number: 5,548,249
[45] Date of Patent: Aug. 20, 1996

[54] CLOCK GENERATOR AND METHOD FOR GENERATING A CLOCK

[75] Inventors: Masaya Sumita, Osaka; Toshinori Maeda; Toru Kakiage, both of Neyagawa, all of Japan

[73] Assignee: Matsushita Electric Industrial Co., Ltd., Kadoma, Japan

[21] Appl. No.: 443,577

[22] Filed: May 17, 1995

[30] Foreign Application Priority Data

May 24, 1994 [JP] Japan .................................. 6-109664

[51] Int. Cl.$^6$ .................. H03L 7/08; H03L 7/16
[52] U.S. Cl. .................. 331/1 A; 331/2; 331/8; 331/16; 331/17; 331/25; 331/173; 327/107; 327/150; 327/159
[58] Field of Search .................. 331/1 A, 2, 3, 331/8, 16, 17, 18, 25, 96, 173; 327/105, 107, 147–150, 156–159; 315/151, 158; 455/260; 360/51

[56] References Cited

U.S. PATENT DOCUMENTS

| | | | |
|---|---|---|---|
| 3,388,339 | 6/1968 | Malnar et al. | 331/3 |
| 4,743,864 | 5/1988 | Nakagawa et al. | 331/1 A |
| 4,837,781 | 6/1989 | Hickling | 375/81 |
| 5,065,115 | 11/1991 | Pletz-Kirsch et al. | 331/14 |
| 5,294,895 | 3/1994 | Feeney et al. | 331/96 X |

FOREIGN PATENT DOCUMENTS

| | | |
|---|---|---|
| 0415047 | 4/1995 | European Pat. Off. . |
| 61-156870 | 7/1986 | Japan . |
| 326020 | 2/1991 | Japan . |
| 612502 | 4/1991 | Japan . |

*Primary Examiner*—David Mis
*Attorney, Agent, or Firm*—Renner, Otto, Boisselle & Sklar, P.L.L.

[57] ABSTRACT

The clock generator of this invention includes: an input shutoff control circuit for receiving a base clock and a reference clock and outputting a first signal and a second signal in response to a reset signal, a phase comparator for outputting a phase difference signal indicating a phase difference between the first signal and the second signal; a voltage control oscillator for outputting a frequency variable clock in correspondence with the phase difference signal; and a voltage fixing control circuit for controlling a voltage of the phase difference signal in response to the reset signal, wherein, when the reset signal is in a first level, the input shutoff control circuit: outputs the base clock to the phase comparator as the first signal and outputs the reference clock to the phase comparator as the second signal, and the voltage fixing control circuit holds the voltage of the phase difference signal, and when the reset signal is in a second level different from the first level, the input shutoff control circuit outputs two signals to the phase comparator as the first signal and the second signal, the phase difference between the two signals being substantially zero, and the voltage fixing control circuit fixing the voltage of the phase difference signal to a predetermined voltage at which the voltage control oscillator does not oscillate.

23 Claims, 19 Drawing Sheets

5,548,249

CLOCK GENERATOR AND METHOD FOR GENERATING A CLOCK

BACKGROUND OF THE INVENTION

1. Field of the Invention

The present invention relates to a clock generator and a method for generating a clock.

2. Description of the Related Art

FIG. 22 shows a configuration of a conventional phase lock loop circuit (PLL circuit) 291 and a configuration of a semiconductor device 300 including the PLL circuit 291. The PLL circuit 291 includes a phase comparator 11, a loop filter 12, a voltage control oscillator 13, and a programmable frequency-divider 292.

A base clock 100 and a reference clock 103 are input into the phase comparator 11. The base clock 100 is normally obtained by frequency-dividing a square wave generated by an external crystal oscillator (not shown) of the semiconductor device 300 by a frequency-divider (not shown). An output of the programmable frequency-divider 292 is supplied to the phase comparator 11 as the reference clock 103. The phase comparator 11 compares the phase of the base clock 100 with the phase of the reference clock 103, and outputs a signal 101 indicating the phase difference between the base clock 100 and the reference clock 103. The loop filter 12 eliminates a high-frequency component from the signal 101. The voltage control oscillator 13 outputs a frequency-variable clock 296 in correspondence with the signal 102 output from the loop filter 12. Thus, the clock 296 having an oscillating frequency corresponding to the signal 102 is output from the voltage control oscillator 13.

The clock 296 output from the voltage control oscillator 13 is input into a function block A 294 and a function block B 295 of the semiconductor device 300 via a clock buffer 293. The function block A 294 and the function block B 295 are both function blocks requiring clock input. The clock 296 input into the function block A 294 is then input into the programmable frequency-divider 292 of the PLL circuit 291.

The basic operation cf the PLL circuit 291 will be described.

Assume that the frequency of the base clock 100 input into the phase comparator 11 is f1 and the frequency of the clock 296 output from the voltage control oscillator 13 is f2. Also assume that the programmable frequency-divider 292 outputs a signal having a frequency 1/N times as high as the frequency of the input signal, where N is a natural number.

Then, the base clock 100 having a frequency f1 and the reference clock 103 having a frequency f2/N are input into the phase comparator 11. When the phase difference between the base clock 100 and the reference clock 103 is zero, the signal 101 output from the phase comparator 11 is zero. As a result, the voltage control oscillator 13 continues to oscillate at a frequency f2=N×f1. When the phase difference between the base clock 100 and the reference clock 103 is not zero, the phase comparator 11 outputs the signal 101 indicating the phase difference. The oscillating frequency of the voltage control oscillator 13 is controlled based on the signal 101. More specifically, when the phase of the reference clock 103 is behind the phase of the base clock 100, the voltage control oscillator 13 increases the frequency of the clock 296. When the phase of the reference clock 103 is ahead the phase of the base clock 100, the voltage control oscillator 13 lowers the frequency of the clock 296. The clock 296 output from the voltage control oscillator 13 is fed back to the programmable frequency-divider 292. Thus, as far as the PLL circuit 291 operates normally, the frequency of the clock 296 output from the voltage control oscillator 13 is fixed to f2=N×f1. This state where the frequency of the clock 296 is fixed is referred to as a lock state.

By transmitting the clock 296 output from the voltage control oscillator 13 of the PLL circuit 291 to the function blocks, a clock having a multiplication (in this case, N times) of the frequency of the base clock 100 is obtained inside the semiconductor device 300. The delay of the clock 296 from the output of the clock buffer 293 until the output of the programmable frequency-divider 292 and the delay of the base clock 100 input from the outside may be identical to each other, so that the problem of clock skew occurring between the outside and the inside of the semiconductor device 300 can be reduced.

However, the conventional clock generator has the following disadvantages:

In recent years, in order to reduce the power consumption of a system, an approach of halting the application of a clock signal to a semiconductor device depending on the situation has been adopted. However, since many PLL circuits are operated under a free-run condition, it is difficult to halt the PLL circuits without causing the trouble of DC path.

When the lock state of the PLL circuit is released due to a noise at the loop filter and the like, the clock skew between the outside and the inside of the semiconductor device may increase, adversely affecting the operation of the system.

At the activation of the system, the system must wait for the PLL circuit turning into a lock state. This time loss results in requiring a long time before the system is activated.

In the conventional PLL circuit, the pulse width of a clock generated by the PLL circuit is set at a predetermined value by the voltage control oscillator or the frequency-divider. Accordingly, an inconvenience with regard to the pulse width of the clock caused by the variation in a process parameter and the like may be found after the fabrication of the PLL circuit. In such a case, it is difficult to improve the inconvenience.

Conventionally, when a clock is distributed to function blocks of the semiconductor device, some inconveniences arise caused by the variation in the line delay of a clock transmitted from clock buffers to the function blocks, difficulties in adjusting the line delay, the clock skew between the outside of the semiconductor device and the function block inside of the semiconductor device, and the like.

SUMMARY OF THE INVENTION

The clock generator cf this invention includes: input shutoff control means:or receiving a base clock and a reference clock and outputting a first signal and a second signal in response to a reset signal; phase comparison means for outputting a phase difference signal indicating a phase difference between the first signal and the second signal; voltage control oscillation means for outputting a frequency variable clock in correspondence with the phase difference signal; and voltage fixing control means for controlling a voltage of the phase difference signal in response to the reset signal. In the clock generator, when the reset signal is in a first level, the input shutoff control means outputs the base clock to the phase comparison means as the first signal and outputs the reference clock to the phase comparison means as the second signal, and the voltage fixing control means holds the voltage of the phase difference signal, and when the reset signal is in a second level different from the first level, the input shutoff control means outputs two signals to the phase comparison means as the first signal and the second signal, the phase difference, between the two signals being substantially zero, and the voltage fixing control means fixing the voltage of the phase difference signal to a predetermined voltage at which the voltage control oscillation means does not oscillate.

According to another aspect of the present invention, an apparatus is provided. The apparatus includes detection means for outputting a reset signal in response to a predetermined condition, a clock generator for generating a clock, and a circuit portion operating in correspondence with the clock. The clock generator includes: input shutoff control means for receiving a base clock and a reference clock and outputting a first signal and a second signal in response to a reset signal; phase comparison means for outputting a phase difference signal indicating a phase difference between the first signal and the second signal; voltage control oscillation means for outputting a frequency variable clock in correspondence with the phase difference signal; and voltage fixing control means for controlling a voltage of the phase difference signal in response to the reset signal, wherein, when the reset signal is in a first level, the input shutoff control means outputs the base clock to the phase comparison means as the first signal and outputs the reference clock to the phase comparison means as the second signal and the voltage fixing control means holds the voltage of the phase difference signal, and when the reset signal is in a second level which is different from the first level, the input shutoff control means outputs two signals to the phase comparison means as the first signal and the second signal, the phase difference between the two signals being substantially zero, and the voltage fixing control means fixes the voltage of the phase difference signal to a predetermined voltage at which the voltage control oscillation means does not oscillate.

According to still another aspect of the present invention, a method for generating a clock is provided. The method uses an apparatus including phase comparison means for receiving a base clock and a reference clock and outputting a phase difference signal indicating a phase difference between the base clock and a reference clock, and voltage control oscillation means for outputting a frequency variable clock in correspondence with the phase difference signal. The method includes the steps of: making the phase difference between the base clock and the reference clock substantially zero in response to a reset signal; and fixing a voltage of the phase difference signal to a predetermined voltage at which the voltage control oscillation means does not oscillate in response to a reset signal.

Alternatively, the clock generator of this invention includes phase comparison means for receiving a base clock and a reference clock and outputting a phase difference signal indicating a phase difference between the base clock and a reference clock; voltage control oscillation means connected to an output of the phase comparison means via first switching means for outputting a frequency variable clock in correspondence with the phase difference signal; constant voltage supply means connected to an input of the voltage control oscillation means via second switching means and connected to the output of the phase comparison means via third switching means for supplying a constant voltage substantially equal to the output of the phase comparison means in a lock state; constant voltage means connected to the output of the phase comparison means via fourth switching means for fixing the output of the phase comparison means to a predetermined voltage; determination means for determining whether or not the phase difference signal exceeds a predetermined threshold value; and control means for controlling ON/OFF of the first switching means through the fourth switching means in correspondence with a result of the determination by the determination means.

Alternatively, the method for generating a clock of this invention using an apparatus including a phase comparison means for receiving a base clock and a reference clock and outputting a phase difference signal indicating a phase difference between the base clock and the reference clock, and a voltage control oscillation means for outputting a frequency variable clock in correspondence with the phase difference signal includes the steps of: determining whether or not the phase difference signal exceeds a predetermined threshold value; supplying a constant voltage substantially equal to the output of the phase comparison means in a lock state to the input of the voltage control oscillation means during a first period having a length corresponding to the phase difference signal in correspondence with a result of the determination; fixing the output of the phase comparison means to a predetermined voltage during a second period included in the first period in correspondence with the result of the determination; and supplying a constant voltage substantially equal to the output of the phase comparison means in the lock state to the output of the phase comparison means during a third period included in the first period and succeeding to the second period in correspondence with the result of the determination.

Alternatively, the clock generator of this invention includes: phase comparison means for receiving a base clock and a reference clock and outputting a phase difference signal indicating a phase difference between the base clock and a reference clock; voltage control oscillation means connected to an output of the phase comparison means via first switching means for outputting a frequency variable clock in correspondence with the phase difference signal; constant voltage supply means, connected to an input of the voltage control oscillation means via second switching means and connected to the output of the phase comparison means via third switching means, for supplying a constant voltage substantially equal to the output of the phase comparison means in a lock state; constant voltage means connected to the output of the phase comparison means via fourth switching means for fixing the output of the phase comparison means to a predetermined voltage; means for receiving a lock indication signal; and control means for controlling ON/OFF of the first switching means through the fourth switching means in correspondence with the lock indication signal.

Alternatively, the method for generating a clock of this invention using an apparatus including a phase comparison means for receiving a base clock and a reference clock and outputting a phase difference signal indicating a phase difference between the base clock and the reference clock and a voltage control oscillation means for outputting a frequency variable clock in correspondence with the phase difference signal, the method includes the steps of: supplying a constant voltage substantially equal to an output of the phase comparison means in a lock state to the voltage control oscillation means during a first period having a length corresponding to the phase difference signal in correspondence with the lock indication signal; fixing the output of the phase comparison means to a predetermined voltage during a second period included in the first period in correspondence with the lock indication signal; and supplying a constant voltage substantially equal to the output of the phase comparison means in the lock state to the output of the phase comparison means during a third period included in the first period and succeeding the second period in correspondence with the lock indication signal.

Alternatively, the clock generator of this invention includes: phase comparison means for receiving a base clock and a reference clock and outputting a phase difference signal indicating a phase difference between the base clock and the reference clock; voltage control oscillation means for outputting a frequency variable clock in correspondence with the phase difference signal; and pulse width variable frequency division means for frequency-dividing the clock output from the voltage control oscillation means by a predetermined magnification, the frequency division means determining a pulse width of an output of the frequency division means in correspondence with pulse width information.

Alternatively, the clock generator of this invention includes a PLL circuit and a light emitting element for emitting light in response to a clock. The PLL circuit includes: phase comparison means for receiving a base clock and a reference clock and outputting a phase difference signal indicating a phase difference between the base clock and the reference clock; voltage control oscillation means for output:ting a frequency variable clock in correspondence with the phase difference signal; and a light receiving element connected to the phase comparison means for converting light into an electric signal, wherein the light emitting element is connected to an output of the voltage control oscillation means via a clock buffer, light emitted from the light emitting element is input into the light receiving element, and an output of the light receiving element is supplied to the phase comparison means as the reference clock.

Alternatively, the clock generator of this invention comprises a clock circuit and a PLL circuit. The clock circuit includes: first phase comparison means for receiving a first base clock and a first reference clock and outputting a first phase difference signal indicating a phase difference between the first base clock and the first reference clock; first voltage control oscillation means for outputting a first frequency variable clock in correspondence with the first phase difference signal; a light emitting element connected to the first voltage control oscillation means for emitting light in correspondence with the first clock output from the first voltage control oscillation means; and a first light receiving element connected to the first phase comparison means for converting light into an electric signal. The PLL circuit includes: second phase comparison means for receiving a second base clock and a second reference clock and outputting a second phase difference signal indicating a phase difference between the second base clock and the second reference clock; second voltage control oscillation means for outputting a second frequency variable clock in correspondence with the second phase difference signal; and a second light receiving element connected to the second phase comparison means for converting light into an electric signal, wherein light emitted from the light emitting element is input into the first light receiving element and the second light receiving element, the output of the first light receiving element is supplied to the first phase comparison means as the first reference clock, and the output of the second light receiving element is supplied to the second phase comparison means as the second base clock.

Alternatively, the clock generator of this invention includes a clock circuit and a PLL circuit. The clock circuit includes: a light emitting element for receiving a first base clock and emitting light in correspondence with the first base clock. The PLL circuit includes: phase comparison means for receiving a second base clock and a reference clock and outputting a phase difference signal indicating a phase difference between the second base clock and the reference clock; voltage control oscillation means for outputting a frequency variable clock in correspondence with the phase difference signal; and a light receiving element connected to the phase comparison means for converting light into an electric signal, wherein light emitted from the light emitting element is input into the light receiving element, and the output of the light receiving element is supplied to the phase comparison means as the second base clock.

Alternatively, the clock generator of this invention includes a clock circuit and a PLL circuit. The clock circuit includes: first phase comparison means for receiving a first base clock and a first reference clock and outputting a first phase difference signal indicating a phase difference between the first base clock and the first reference clock; first voltage-control oscillation means for outputting a first frequency variable clock in correspondence with the first phase difference signal; a first light emitting element connected to the first voltage control oscillation means for emitting light in correspondence with the first clock output from the first voltage control oscillation means; and a first light receiving element connected to the first phase comparison means for converting light into an electric signal. The PLL circuit includes: second phase comparison means for receiving a second base clock and a second reference clock and outputting a second phase difference signal indicating a phase difference between the second base clock and the second reference clock; second voltage control oscillation means for outputting a second frequency variable clock in correspondence with the second phase difference signal; a second light emitting element connected to an output of the second voltage control oscillation means via a clock buffer for emitting light in response to an output of the clock buffer; and a second light receiving element connected to the second phase comparison means for converting light into an electric signal, wherein light emitted from the first light emitting element is input into the second light receiving element, light emitted from the second light emitting element is input into the first light receiving element, an output of the first light receiving element is supplied to the first phase comparison means as the first reference clock, and the output of the second light receiving element is supplied to the second phase comparison means as the second base clock.

Alternatively, the method for generating a clock of this invention using a PLL circuit for receiving a base clock and a reference clock and outputting an output clock in response to the base clock and a light emitting element connected to the output clock via a clock buffer for emitting light in response to an output of the clock buffer includes the step of: transmitting the output of the clock buffer to the PLL circuit as the reference clock by use of the light emitted from the light emitting element.

Alternatively, the method for generating a clock of this invention using a light emitting element for emitting light in response to an external clock and a PLL circuit for receiving a base clock and a reference clock and outputting an output clock in response to the base clock includes the step of: transmitting the external clock to the PLL circuit as the base clock by use of the light emitted from the light emitting element.

Thus, the invention described herein makes possible the advantages of (1) providing a clock generator and a method for generating a clock where a PLL circuit is completely halted without generating a DC path when the application of a clock signal to a semiconductor device is halted; (2) providing a clock generator and a method for generating a clock where a PLL circuit is compulsively locked by promptly returning the state of the PLL circuit to a lock state when the lock state of the PLL circuit is released; (3) providing a clock generator and a method for generating a clock where the setup time required for the activation of the system is shortened; (4) providing a clock generator and a method for generating a clock where the pulse width of a clock can be easily changed after the fabrication of a PLL circuit; and (5) providing a clock generator and a method for generating a clock where a clock is distributed to function blocks in a semiconductor device by use of light, so that the clock skew between the outside and the function blocks inside the semiconduct device is improved.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 1:
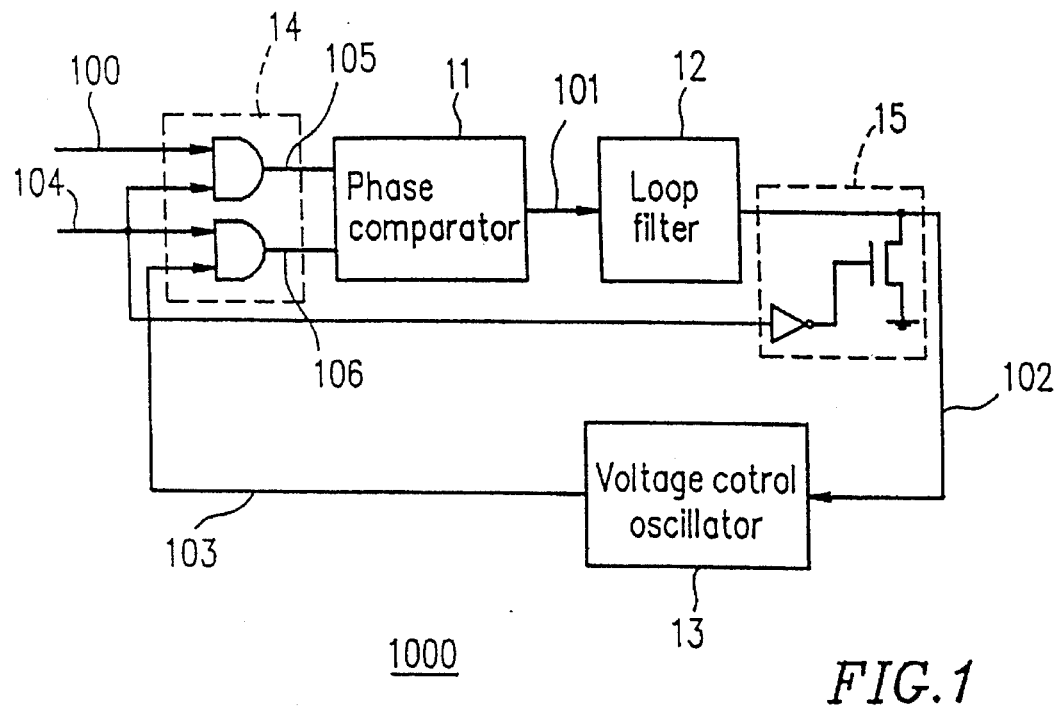
FIG. 1 is a block diagram of a PLL circuit 1000 of a first example according to the present invention.

FIG. 1 shows a PLL circuit 1000 of Example 1 according to the present invention. The PLL circuit 1000 of this example has a function of resetting itself in response to a reset signal.

The PLL circuit 1000 includes a phase comparator 11, a loop filter 12, and a voltage control oscillator 13. The phase comparator 11 receives a base clock and a reference clock and outputs a signal 101 indicating the phase difference between the base clock and the reference clock. The loop filter 12 filters the signal 101 to eliminate a harmonic component therefrom. The voltage control oscillator 13 outputs a frequency variable reference clock 103 in correspondence with a signal 102 output from the loop filter 12. In this way, the phase difference signal 101 output from the phase comparator 11 is transmitted to the voltage control oscillator 13 via the loop filter 12. The loop filter 12 is provided to ensure the transmission of the phase difference between the base clock and the reference clock to the voltage control oscillator 13.

The signal 102 output from the loop filter 12 works as a control voltage for controlling the oscillating frequency of the voltage control oscillator 13. The oscillating frequency of the voltage control oscillator 13 is proportional to the control voltage. When the control voltage is 0 V, the voltage control oscillator 13 does not oscillate, resulting in that the reference clock 103 output from the voltage control oscillator 13 is 0 V.

The phase comparator 11, the loop filter 12, and the voltage control oscillator 13 may be the same as ones conventionally used, and may be formed on one semiconductor substrate by a known technique.

The PLL circuit 1000 further includes an input shutoff control circuit 14 and a voltage fixing control circuit 15, which are both specific to the PLL circuit 1000 of the present invention.

The input shutoff control circuit 14 controls the transmission of the base clock 100 and the reference clock 103 to the phase comparator 11 in correspondence with a reset signal 104. The logic of the reset signal 104 is negative. That is, the PLL circuit 1000 is reset when the reset signal 104 is at a low level. More specifically, when the reset signal 104 is at the low level, signals 105 and 106 are output from the input shutoff control circuit 14 to the phase comparator 11 in such a relationship that the phase difference between these signals 105 and 106 is zero. In the case of the input shutoff control circuit 14 shown in FIG. 1, when the reset signal 104 is at the low level, the signals 105 and 106 are set at a low level. When the reset signal 104 is at a high level, the input shutoff control circuit 14 outputs a non-inverted signal of the base clock 100 to the phase comparator 11 as the signal 105, and outputs a non-inverted signal of the reference clock 103 to the phase comparator 11 as the signal 106.

When the reset signal 104 is at the low level, the voltage fixing control circuit 15 pulls down the voltage of the signal 102 output from the loop filter 12 to 0 V. When the reset signal 104 is at the high level, the voltage fixing control circuit 15 holds the voltage of the signal 102 output from the loop filter 12. The capacitance and the resistance at the portion connecting the voltage fixing control circuit 15 with the signal 102 are designed to be so small that the performance of the loop filter 12 will not be affected.

The operation of the PLL circuit 1000 having the above described configuration will be described.

When the reset signal 104 is at the high level, the base clock 100 and the reference clock 103 pass through the input shutoff control circuit 14 and input into the phase comparator 11. The phase comparator 11 thus outputs the signal 101 indicating the phase difference between the base clock 100 and the reference clock 103. The loop filter 12 eliminates a harmonic component from the signal 191 output from the phase comparator 11. The oscillating frequency of the voltage control oscillator 13 is controlled in correspondence with the signal 102 output from the loop filter 12. The voltage fixing control circuit 15 holds the voltage of the signal 102 output from the loop filter 12. Thus, when the reset signal 104 is at the high level, the operation of the PLL circuit 1000 is the same as that of the conventional PLL circuit.

When the reset signal 104 is at the low level, the signals 105 and 106 output from the input shutoff control circuit 14 are always at the low level. Accordingly, the phase difference between the signals 105 and 106 is zero, and thus the signal 101 output from the phase comparator 11 is zero. The loop filter 12 holds the voltage value of the signal 102, but the voltage of the signal 102 is pulled down to 0 V by the voltage fixing control circuit 15. As a result, the voltage control oscillator 13 does not oscillate, outputting the signal 103 of a low level.

The PLL circuit may also be reset by cutting the supply of power to the PLL circuit. In this method, however, in order to shut off a current path, a switching transistor which allows a necessary current to flow to the PLL circuit is required. Such a transistor is very large in scale, increasing an area occupied by the PLL circuit and thus increasing the cost.

The generation of a DC path at the resetting of the PLL circuit can be suppressed to some extent by preventing the voltage control oscillator from oscillating. This is because at least the generation of the DC path in the voltage control oscillator can be prevented. The "DC path" as used herein refers to a path of current flowing from an electric source toward the ground. Accordingly, the method of "preventing the voltage control oscillator from oscillating at the resetting" is better than the method of "cutting the supply of power to the PLL circuit at the resetting" in the point that the area occupied by the PLL circuit is small (the cost is low).

However, the generation of a DC path can not be completely prevented only by preventing the voltage control oscillator from oscillating at the resetting. A DC path is also generated in the phase comparator since the base clock is input into the phase comparator.

According to the PLL circuit 1000 of the present invention, in order to solve the above problem, not only the control voltage of the voltage control oscillator 13 is controlled so as to prevent the voltage control oscillator 13 from oscillating, but also the phase difference between the two signals input into the phase comparator 11 is made zero at the resetting. As a result, since the generation of a DC path is completely prevented in both the voltage control oscillator 13 and the phase comparator 11, the PLL circuit 1000 can be completely halted without generating a DC path. The timing at which the oscillation of the voltage control oscillator 13 is halted is preferably substantially simultaneous with the timing at which the phase difference between the two signals input into the phase comparator 11 is made zero.

In this example shown in FIG. 1, the voltage of the signal 102 output from the loop filter 12 is pulled down to 0 V at the resetting by the voltage fixing control circuit 15. The voltage value obtained by the pulling down by the voltage fixing control circuit 15 is not necessarily 0 V. For example, when the voltage control oscillator 13 is specified as "not oscillating when the control voltage is 3 V", the voltage of the signal 102 output from the loop filter 12 should be pulled down to 3 V at the resetting. The importance is that, at the resetting, the voltage fixing control circuit 15 fixes the voltage of the signal 102 output from the loop filter 12 at a predetermined voltage value at which the voltage control oscillator 13 does not oscillate.

Figure 2:
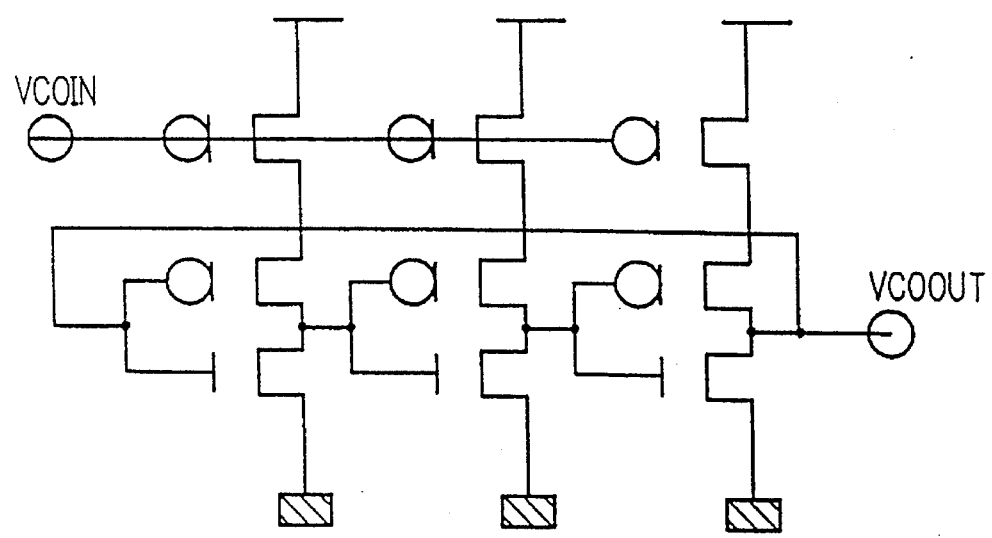
FIG. 2 is a circuit diagram of a voltage fixing control circuit of the PLL circuit 1000.

FIG. 2 shows an exemplified configuration of the voltage fixing control circuit 15 in the case where the voltage of the signal 102 output from the loop filter 12 is pulled down to 3 V.

In Example 1 shown in FIG. 1, the input shutoff control circuit 14 sets both of the signals 105 and 106 at a low level at the resetting. Alternatively, the input shutoff control circuit 14 may set the signals 105 and 106 at a high level at the resetting. The input shutoff control circuit 14 may also output the signals 105 and 106 at the resetting so that they have the same phase. The importance is that the input shutoff control circuit 14 outputs the signals 105 and 106 at the resetting so that the phase difference therebetween is zero.

The reset signal 104 is supplied from a detection circuit (not shown). The detection circuit sets the reset signal 104 at a low level only when it detects a predetermined condition. Such a predetermined condition includes a condition where a clock having a frequency one-hundredth or less of the frequency of the base clock (for example, 25 kHz) is input into the PLL circuit 1000 and a condition where all function blocks in a semiconductor device do not need a clock.

In Example 1, the output from the voltage control oscillator 13 is used as the reference clock 103. Alternatively, the output from the voltage control oscillator 13 may be connected to a programmable frequency-divider and an output of the programmable frequency-divider may be used as the reference clock 103.

Thus, according to the PLL circuit of Example 1, the control voltage of the voltage control oscillator 13 is controlled in response to the reset signal so as to prevent the voltage control oscillator 13 from oscillating. Simultaneously, the phase difference between the two signals input into the phase comparator 11 is made zero. This allows the PLL circuit to be halted without generating a DC path. As a result, power consumed by the PLL circuit can be greatly reduced.

EXAMPLE 2

Figure 3:
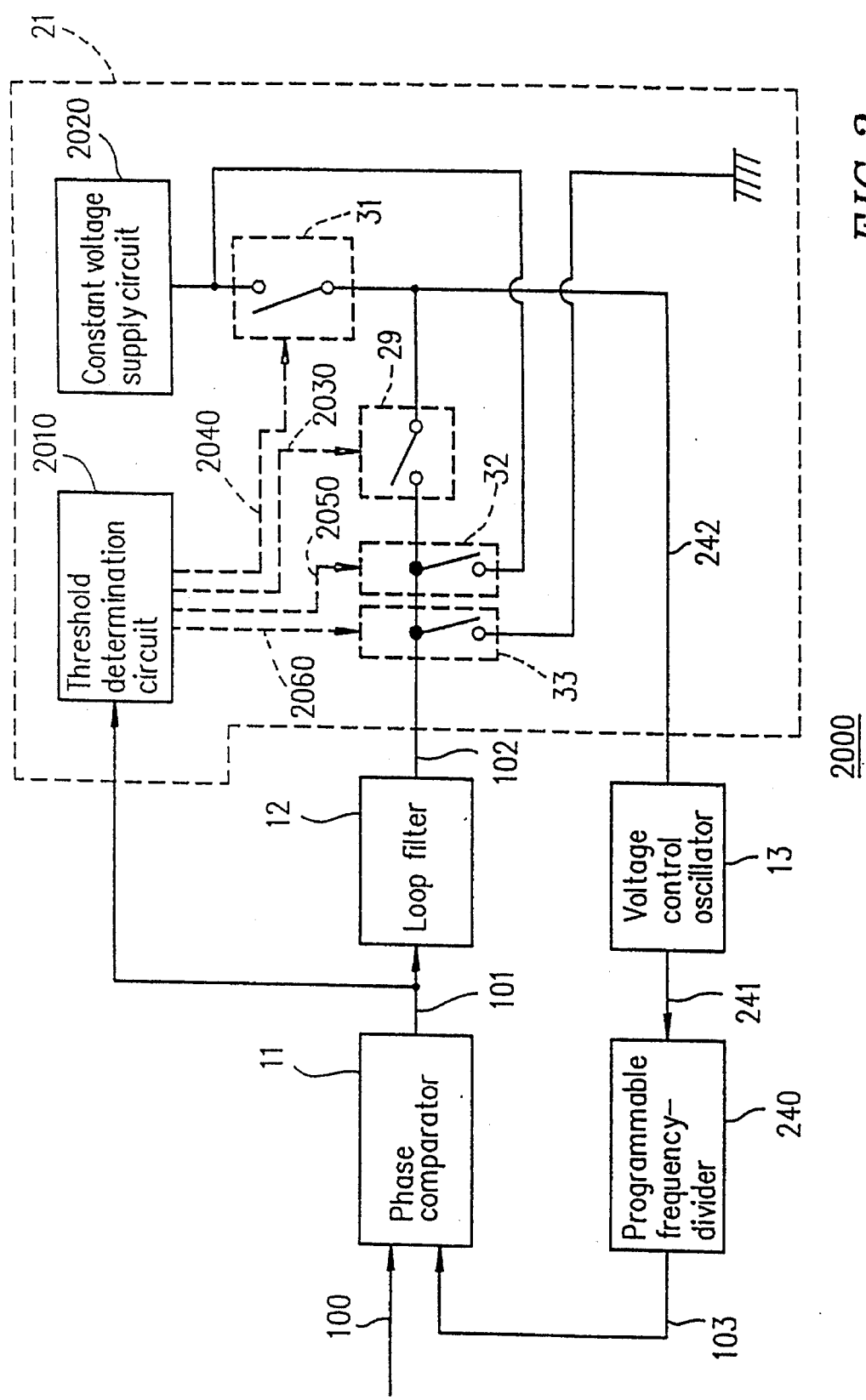
FIG. 3 is diagram of a PLL circuit 2000 of a second example according to the present invention.

FIG. 3 shows a PLL circuit 2000 of a second example according to the present invention. The PLL circuit 2000 of this example has a function of compulsively maintaining the lock state thereof.

The PLL circuit 2000 includes a phase comparator 11, a loop filter 12, and a voltage control oscillator 13. These components are the same as those of the PLL circuit 1000, and thus: the description thereof is omitted. The PLL circuit 2000 further includes a programmable frequency-divider 240 which frequency-divides a clock 241 output from the voltage control oscillator 13 so as to output a reference clock 103.

The PLL circuit 2000 further includes a compulsory lock circuit 21 which is specific to the PLL circuit 2000 according to the present invention.

The compulsory lock circuit 21 includes a threshold determination circuit 2010, a constant voltage supply circuit 2020, and switch circuits 29, 31, 32, and 33. The threshold determination circuit 2010 determines whether or not the phase difference between a base clock 100 and the reference clock 103 has exceeded a predetermined threshold value, and controls the ON/OFF of the switch circuits 29, 31, 32, and 33 in correspondence with the determination result. The constant voltage supply circuit 2020 supplies a predetermined voltage. The predetermined voltage is preset so as to be equal to a voltage of a signal 102 output from the loop filter 12 when the PLL circuit 2000 is in the lock state. The ON/OFF of the switch circuits 29, 31, 32, and 33 are controlled in correspondence with control signals 2030, 2040, 2050, and 2060 generated by the threshold determination circuit 2010.

When the switch circuit 29 is ON, the output of the loop filter 12 is coupled to the voltage control oscillator 13. When the switch circuit 31 is ON, the output of the constant voltage supply circuit 2020 is coupled to the voltage control oscillator 13. The switch circuit 29 is controlled by the threshold determination circuit 2010 so that it is turned OFF when the phase difference between the base clock 100 and the reference clock 103 exceeds a predetermined threshold value and otherwise it is turned ON. The switch circuit 31 is controlled by the threshold determination circuit 2010 so that it is turned ON when the phase difference between the base clock 100 and the reference clock 103 exceeds a predetermined threshold value and otherwise it is turned OFF.

When the switch circuit 33 is ON, the output of the loop filter 12 is grounded. When the switch circuit 32 is ON, the output of the loop filter 12 is coupled to the output of the constant voltage supply circuit 2020.

Figure 4:
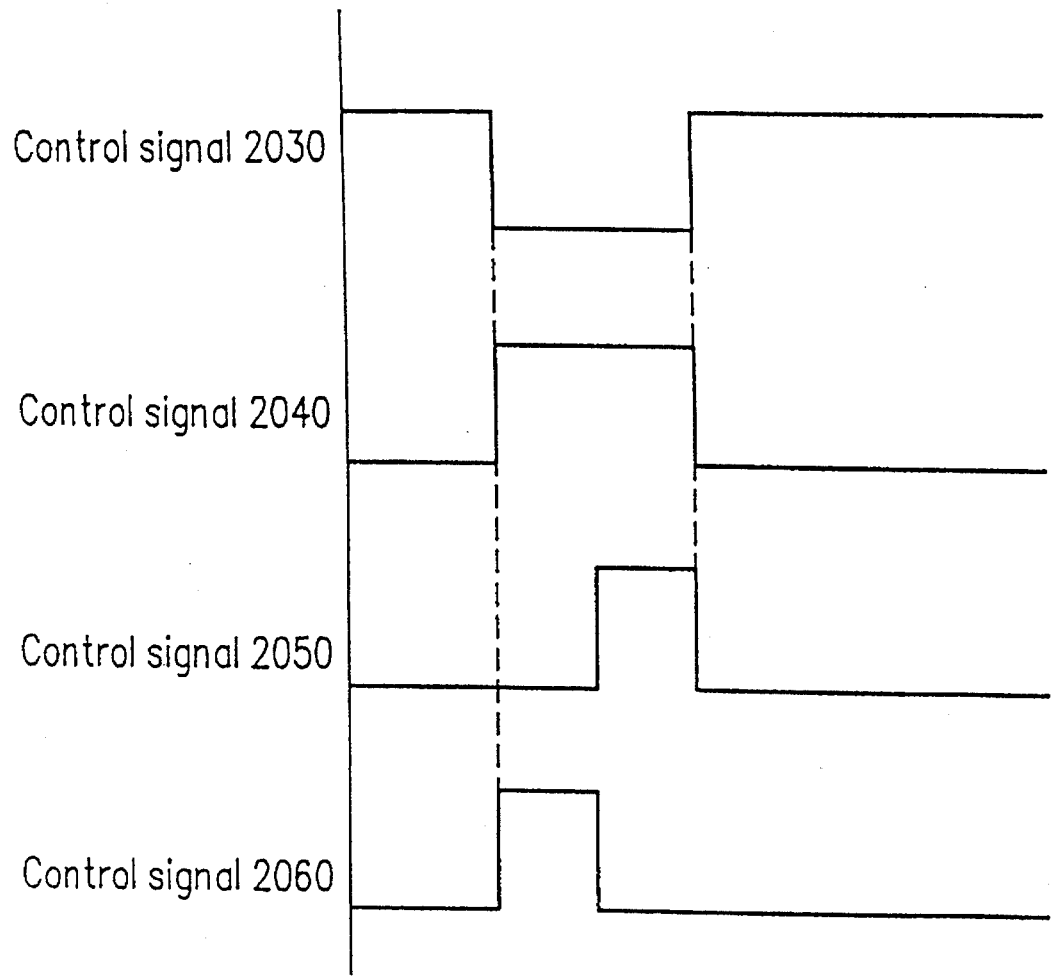
FIG. 4 shows waveforms of control signals generated by a threshold determination circuit 2010 of the PLL circuit 2000.

FIG. 4 shows waveforms of the control signals 2030, 2040, 2050, and 2060 generated by the threshold determination circuit 2010.

When the phase difference between the base clock 100 and the reference clock 103 exceeds a predetermined threshold value, the threshold determination circuit 2010 determines that the lock state of the PLL circuit 2000 has been released. In order to resume the lock state of the PLL circuit 2000, the threshold determination circuit 2010 turns OFF the switch circuit 29 and turns ON the switch circuit 31 by means of the control signals 2030 and 2040, respectively. As a result, the output of the constant voltage supply circuit 2020, instead of the output of the loop filter 12, is supplied to the voltage control oscillator 13. The output of the constant voltage supply circuit 2020 is equal to the output Of the loop filter 12 when the PLL circuit 2000 is in the lock state. Accordingly, the PLL circuit 2000 is apparently in the same state as the lock state.

While the switch circuit 29 is OFF, the switch circuit 33 is turned ON and subsequently the switch circuit 32 is turned ON by means of the control signals 2050 and 2060, respectively. By this operation, the output of the constant voltage supply circuit 2020 is coupled to the output 102 of the loop filter 12. This makes it possible to resume the lock state of the PLL circuit 2000 even if the voltage of the output 102 of the loop filter 12 when the look state of the PLL circuit 2000 has been released is higher than the control voltage 242 of the voltage control oscillator 13 when the PLL circuit 2000 is in the lock state.

Figure 5:
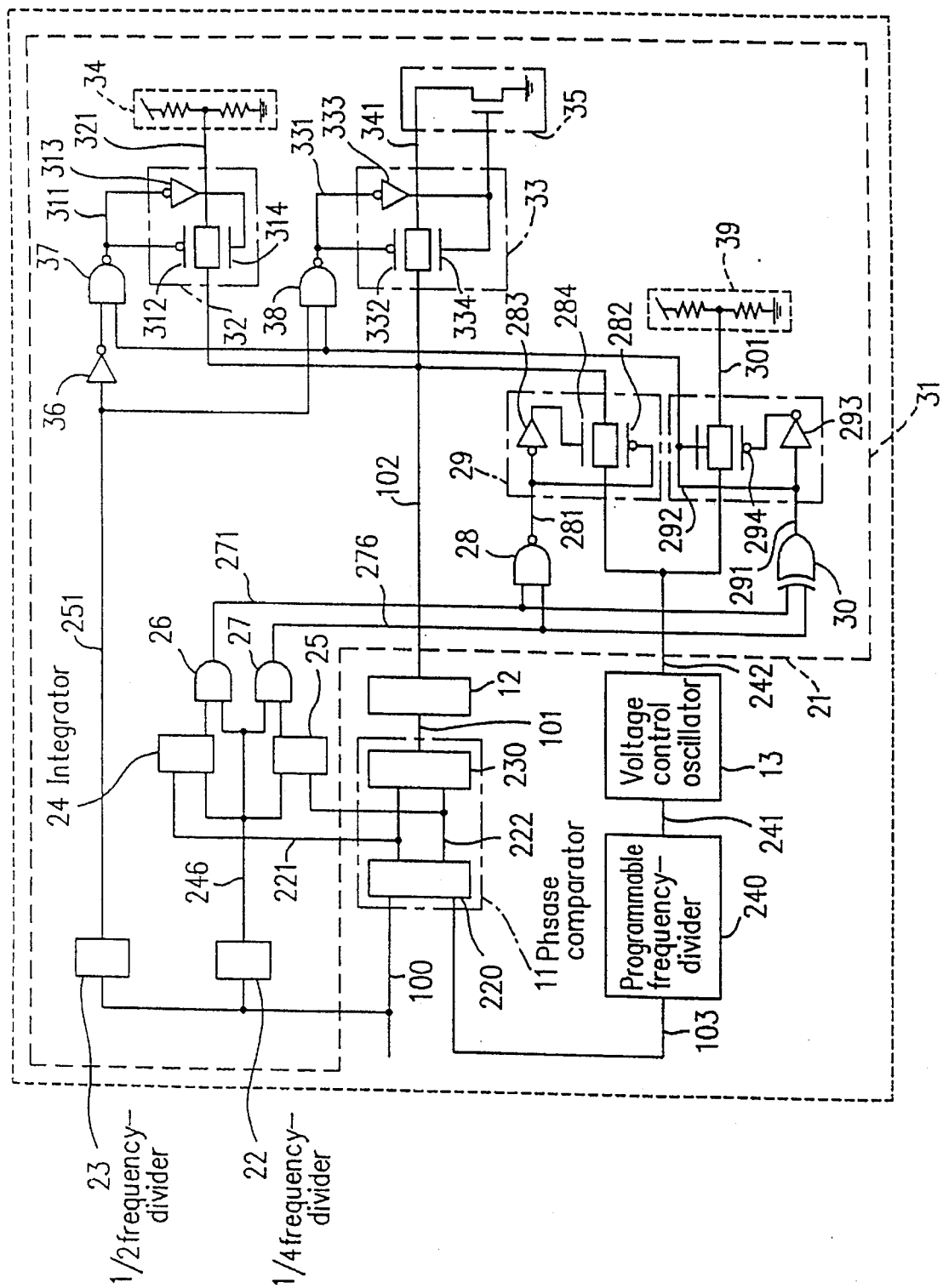
FIG. 5 is a circuit diagram showing the PLL circuit 2000 in more detail.

FIG. 5 shows the configuration of the PLL circuit 2000 in more detail.

The phase comparator 11 includes a digital phase comparator 220 and a charge pump 230. A digital signal output from the digital phase comparator 220 is output onto two signal lines (an UP line 221 and a DOWN line 222). When the phase of the reference clock 103 is behind the phase of the base clock 100, the UP line is at the low level during the time period corresponding to the phase difference, while the DOWN line 222 maintains the high level. When the phase of the reference clock 103 is ahead the phase of the base clock 100, the DOWN line 222 is at the low level during the time period corresponding to the phase difference, while the up line 221 maintains the high level. The UP line 221 and the DOWN line 222 are connected to the charge pump 230. The charge pump 230 transforms the digital signal output from the digital phase comparator 220 into an analog amount.

The compulsory lock circuit 21 includes various logic elements. Among them, a frequency-divider 22 frequency-divides the base clock 100 into four. A frequency-divider 23 frequency-divides the base clock 100 into two. An inverting circuit 36 inverts an output 251 of the frequency-divider 23.

Figure 6:
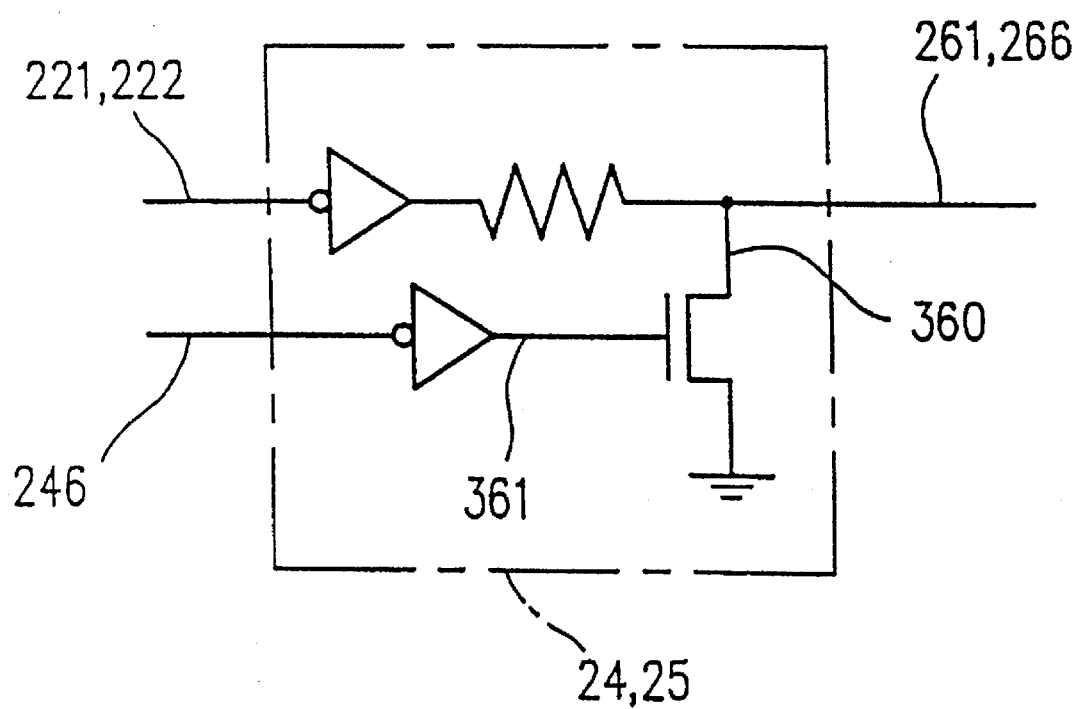
FIG. 6 is a circuit diagram showing integrators 24 and 25 of the PLL circuit 2000.

FIG. 6 shows a configuration of integrators 24 and 25. A capacitance 360 is composed of the drain of a transistor, and to the gate of the transistor is connected an inverted signal 361 of an output 246 from the frequency-divider 22. The inputs of the integrators 24 and 25 are connected to the UP line 221 and the DOWN line 222, respectively.

An AND circuit 26 receives an output 261 of the integrator 24 and the output 246 of the frequency-divider 22. An AND circuit 27 receives an output 266 of the integrator 25 and the output 246 of the frequency-divider 22. A NAND circuit 28 receives an output 271 of the AND circuit 26 and an output 276 of the AND circuit 27.

The switch circuit 29 includes an inverting circuit 283, a p-channel transistor (hereinafter, referred to as a p-type TR) 282, and an n-channel transistor (hereinafter, referred to as an n-type TR) 284. An output 281 of the NAND circuit 28 is connected to the gate of the p-type TR 282 and the input of the inverting circuit 283. The output of the inverting circuit 283 is connected to the gate of the n-type TR 284. The drain of the p-type TR 282 and the drain of the n-type TR 284 are connected to the output 102 of the loop filter 12. The source of the p-type TR 282 and the source of the n-type TR 284 are connected to the control signal 242 of the voltage control oscillator 13. A counter-matching circuit 30 receives the output 271 of the AND circuit 26 and the output 276 of the AND circuit 27.

The switch circuit 31 includes an inverting circuit 293, a p-type TR 294 and an n-type TR 292. An output 291 of the counter-matching circuit 30 is connected to the gate of the n-type TR 292 and the input of the inverting circuit 293. The output of the inverting circuit 293 is connected to the gate of the p-type TR 294. The drain of the n-type TR 292 and the drain of the p-type TR 294 are connected to an output 301 of a constant voltage circuit 39. The source of the n-type TR 292 and the source of the p-type TR 294 are connected to the control signal 242 of the voltage control oscillator 13. A NAND circuit 37 receives the output 291 of the counter-matching circuit 30 and the output of the inverting circuit 36.

The switch circuit 32 includes an inverting circuit 313, a p-type TR 312 and an n-type TR 314. An output 311 of the NAND circuit 37 is connected to the gate of the p-type TR 312 and the input of the inverting circuit 313. The output of the inverting circuit 313 is connected to the gate of the n-type TR 314. The drain of the n-type TR 314 and the drain of the p-type TR 312 are connected to an output 321 of a constant voltage circuit 34. The source of the n-type TR 314 and the source of the p-type TR 312 are connected to the output 102 of the loop filter 12. A NAND circuit 38 receives the output 291 of the counter-matching circuit 30 and the output 251 of the frequency-divider 23. An output 331 of the NAND circuit 38 is connected to the gate of a p-type TR 332 and the input of an inverting circuit 333.

The switch circuit 33 includes the inverting circuit 333, a p-type TR 332 and an n-type TR 334. The output of the inverting circuit 333 is connected to the gate of the n-type TR 334. The drain of the n-type TR 334 and the drain of the p-type TR 332 are connected to an output 341 of a constant voltage circuit 35. The constant voltage control circuit 35 is controlled by the output of the inverting circuit 333. The source of the n-type TR 334 and the source of the p-type TR 332 are connected to the output 102 cf the loop filter 12.

The operation of the PLL circuit 2000 with the above-described configuration will be described with reference to FIG. 7.

Figure 7:
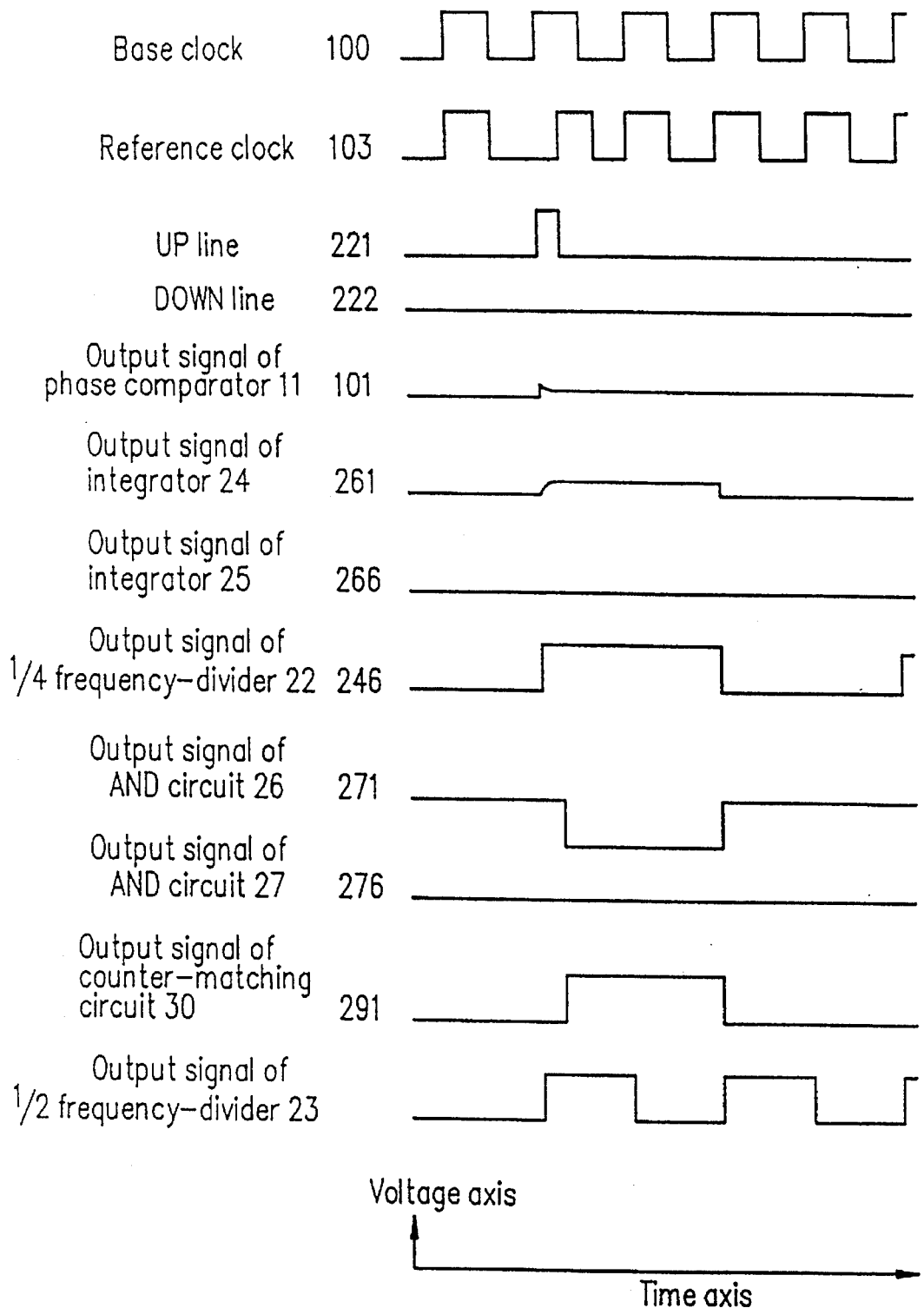
FIG. 7 is a timing chart showing the operation of the PLL circuit 2000.

FIG. 7 is a timing chart showing the case where the phase of the reference clock 103 becomes behind the phase of the base clock 100 when the lock state of the PLL circuit 2000 has been released due to a trouble such as noise intrusion into the PLL circuit 2000 or other portions.

The up line 221 is at the low level during the time period corresponding to the phase difference between the base clock 100 and the reference clock 103, while the down line 222 maintains the high level. The voltage of the output 261 of the integrator 24 increases by a time constant determined by the resistance and the capacitance of the integrator 24. After the time period corresponding to the phase difference between the base clock 100 and the reference clock 103, the voltage is maintained at a constant value during two cycles of the base clock 100, and then becomes zero. A threshold value for determining whether the compulsory lock circuit 21 is activated or not can be preset at any selected value by adjusting the threshold value of the AND circuit 26 and the resistance and the capacitance of the integrator 24.

When the phase difference between the base clock 100 and the reference clock 103 exceeds a predetermined threshold value, the output 271 of the AND circuit 26 becomes a high level. The switch circuit 29 is turned OFF, while the switch circuit 31 is turned ON. As a result, the output 102 of the loop filter 12 is not transmitted to the voltage control oscillator 13, but the output 301 of the constant voltage circuit 39 is transmitted to the voltage control oscillator 13. The output 301 of the constant voltage circuit 39 supplies a constant voltage to the voltage control oscillator 13. The constant voltage is preset at the same value as the voltage of the output 102 of the loop falter 12 obtained when the PLL circuit 2000 is in the lock state. In this way, whether or not the lock state of the PLL circuit 2000 has been released is determined by comparing the phase difference between the base clock 100 and reference clock 103 with the predetermined threshold. When it is determined that the lock state of the PLL circuit 2000 has been released, the constant voltage equal to the voltage of the output 102 of the loop filter 12 obtained when the PLL circuit 2000 is in the lock state is supplied to the voltage control oscillator 13. As a result, the PLL circuit 2000 As apparently in the same state as the lock state.

The switch circuit 33 is turned ON only during the first cycle of the base clock 100 in the period when the output 271 of the AND circuit 26 is at the high level. This allows the output 102 of the loop filter 12 to be grounded and become 0 V. The switch circuit 32 is ON only during the second cycle of the base clock 100 in the period when the output 271 of the AND circuit 26 is at the high level. This allows the output 321 of the constant voltage circuit 34 to be coupled to the output 102 of the loop filter 12. The output 321 of the constant voltage circuit 34 supplies a constant voltage to the voltage control oscillator 13. This constant voltage is also preset at the same value as the voltage of the output 102 of the loop filter 12 obtained when the PLL circuit 200 is in the lock state.

In this way, the PLL circuit 2000 resumes the lock state from the third cycle of the base clock 100. This is also applicable to the case where the phase of the reference clock 103 is ahead of the phase of the base clock 100. In this case, the PLL circuit 2000 also resumes the lock state from the third cycle of the base clock 100.

As is understood from the above description, the threshold determination circuit 2010 shown in FIG. 3 is essentially composed of the frequency-dividers 22 and 23, the integrators 24 and 25, the AND circuits 26 and 27, the NAND circuits. 28, 37, and 38, the counter-matching circuit 30, and the inverting circuit 36 shown in FIG. 5. However, this configuration represents only one example of the threshold determining circuit 2010. The configuration of the threshold determination circuit 2010 is not limited to the circuit configuration shown in FIG. 5. The constant voltage supply circuit 2020 shown in FIG. 3 is essentially composed of the constant voltage circuits 34 and 39. However, the constant voltage supply circuit 2020 is not limited to the circuit configuration shown in FIG. 5.

In this example, the constant voltage circuits were used for supplying the same voltage as that of the output 102 of the loop filter 12 obtained when the PLL circuit 2000 is in the lock state. Other circuits may also be used as far as they store the same voltage as that of the output 102 of the loop filter 12 obtained when the PLL circuit 2000 is in the lock state.

Thus, according to the PLL circuit 2000 of Example 2, the compulsory lock circuit 21 is activated when the phase difference between the base clock 100 and the reference clock 103 exceeds a predetermined threshold value. This makes it possible for the PLL circuit to resume the lock state more promptly than in the case of utilizing a feedback characteristic of the PLL circuit. As a result, function blocks connected to the PLL circuit can continue their operations without degrading the performance.

Next, the operation of the PLL circuit 2000 when the system is activated will be described.

A lock indication signal is input into the switch circuit 31, instead of the output 291 of the counter-matching circuit 30. An inverted signal of the lock indication signal is input into the switch circuit 29, instead of the output 281 of the NAND circuit 28. The lock indication signal is maintained at the high level during four cycles of the base clock 100. This allows the switch circuits 29, 31, 3.2, and 33 of the compulsory lock circuit 21 to operate, and thus the PLL circuit 2000 can resume the lock state in the time required for the phase locking process. Thus, according to this example, a frequency pulling process which is conventionally required at the activation of the system can be omitted. As a result, the setup time required for the activation of the system can be reduced by the time required for the frequency pulling process.

Figure 8:
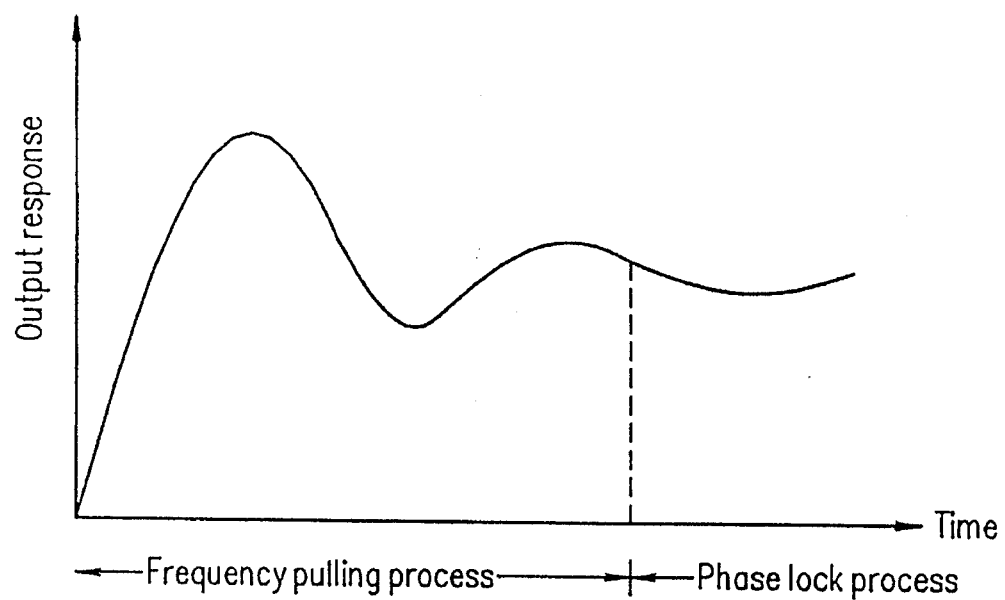
FIG. 8 is a chart showing an example of the transient response of a conventional PLL circuit at the activation of a system.

FIG. 8 shows an example of the transient response of a conventional PLL circuit at the activation of the system. As described above, the frequency pulling process and the phase locking process are required for the activation of the system. According to the present invention, the frequency pulling process can be omitted.

The compulsory lock circuit 21 may further include a two-input selector for selecting one of the lock indication signal and the output 281 of the NAND circuit 28 and a two-input selector for selecting one of the lock indication signal and the output 291 of the counter-matching circuit 30. In this case, the lock indication signal may be selected during the setup time required for the activation of the system, while the output 281 of the NAND circuit 28 and the output 291 of the counter matching circuit 30 may be selected after the setup time, so that both the compulsory lock function and the reduction of the setup time can be realized.

EXAMPLE 3

Figure 9:
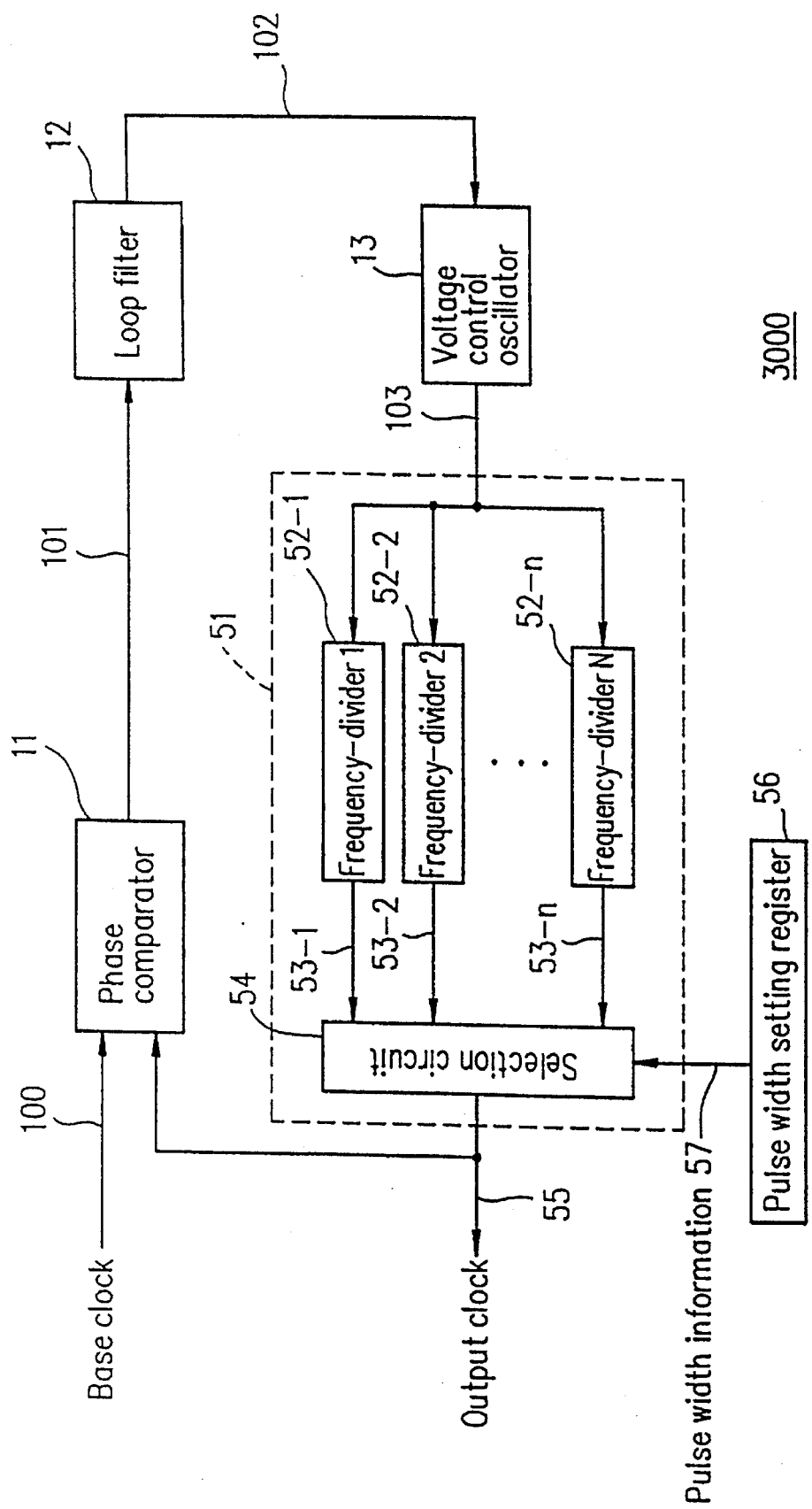
FIG. 9 is a block diagram of a PLL circuit 3000 of a third example according to the present invention.

FIG. 9 shows a PLL circuit 3000 of a third example according to the present invention. The PLL circuit 3000 includes a phase comparator 11, a loop filter 12, and a voltage control oscillator 13. The phase comparator 11 outputs a signal 101 indicating the phase difference between a base clock 100 and a reference clock 55. The loop filter 12 eliminates a harmonic component from the signal 101. The voltage control oscillator 13 outputs a frequency variable clock 103 in correspondence with a signal 102 output from the loop filter 12. The clock 103 is synchronous with the base clock 100 and has a frequency m times the frequency of the base clock 100.

The PLL circuit 3000 further includes a pulse width setting register 56 arid a pulse width variable frequency-divider 51 which frequency-divides the clock 103 output from the voltage control oscillator 13 into 1/m, and outputs the clock 55 having a pulse width selected from a plurality of pulse widths. The pulse width setting register 56 has preset pulse width information 57. The clock 55 is used as the reference clock at the phase comparator 11, as well as being transmitted to other circuits.

The pulse width variable frequency-divider 51 includes n frequency-dividers 52-1 to 52-n which frequency-divides an input signal into n different pulse widths, and a selection circuit 54 which selects one of outputs 53-1 to 53-n of the frequency-dividers 52-1 to 52-n depending on the pulse width information 57.

The operation of the PLL circuit 3000 having the above configuration will be described.

The phase comparator 11 outputs the signal 101 indicating the phase difference between the base clock 100 and the reference clock 55. The loop filter 12 eliminates a harmonic component from the signal 101 output from the phase comparator 11. The frequency of the clock 103 output from the voltage control oscillator 13 is controlled in correspondence with the signal 102 output from the loop filter 12. When the PLL circuit 3000 is in a stable state (lock state), the voltage control oscillator 13 outputs the clock 103 having a frequency m times the frequency of the base clock 100 and a phase little different from the phase of the base clock 100. The frequency of the clock 103 (the value of m) is determined by circuit parameters of the loop filter 12 and the voltage control oscillator 13.

The clock 103 output from the voltage control oscillator 13 is input into the frequency-dividers 52-1 to 52-n of the pulse width variable frequency-divider 51. The frequency-dividers 52-1 to 52-n divide the clock 103 into 1/m and modulate the pulse width of the clock 103 so that the modulated pulse widths of the outputs 53-1 to 53-n of the frequency-dividers 52-1 to 52-n are different from one another.

In this example, assume that the circuit parameters of the loop filter 12 and the voltage control oscillator 13 are preset so that the frequency of the clock 103 is twice the frequency of the base clock 100 (m=2). Thus, the pulse width variable frequency-divider 51 frequency-divides the clock 103 into ½.

Figure 10:
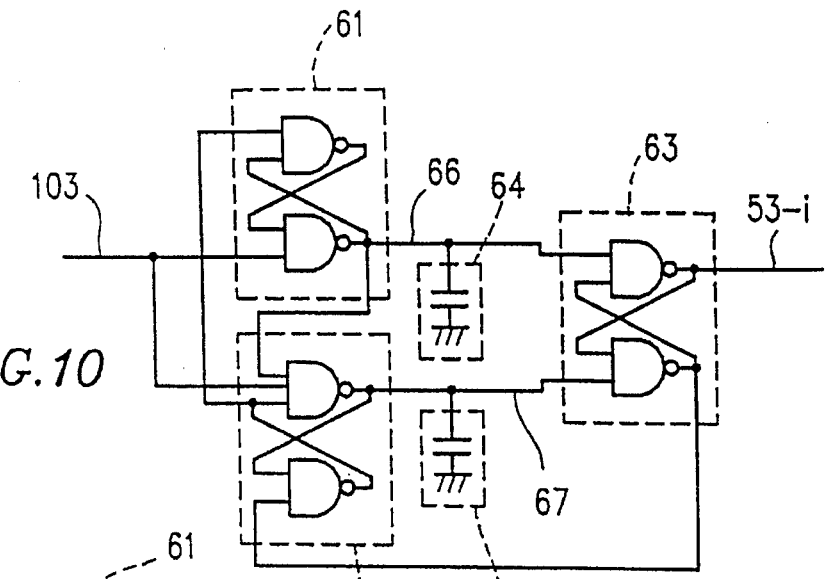
FIG. 10 is a circuit diagram of a frequency-divider 52-i of the PLL circuit 3000.

FIG. 10 shows an example of a frequency-divider 52-i where i is an integer in the range of 1 to n inclusive. The frequency-divider 52-i includes flipflops 61 to 63. Capacitors 64 and 65 are added to outputs 66 and 67 of the flipflops 61 and 62.

The flipflop 63 outputs a clock 53-i having a frequency ½ times the frequency of the clock 103. The pulse width of the clock 53-i is determined by the capacitances of the capacitors 64 and 65. In general, when the capacitance of the capacitor 64 is greater than the capacitance of the capacitor 65, the period when the clock 53-i is at the high level is longer than the period when the clock 53-i is at the low level (the duty ratio of the clock 53-i is more than 50%). When the capacitance of the capacitor 64 is smaller than the capacitance of the capacitor 65, the period when the clock 53-t is at the high level is shorter than the period when the clock 53-i is at the low level (the duty ratio of the clock 53-i is less than 50%).

The frequency-divider 52-i can be configured to output the clock 53-i having a duty ratio of i:(n+1-i), for example, by adjusting the capacitances of the capacitors 64 and 65. The duty ratio of i:(n+1-i) means that the period when the clock 53-t is at the high level is i/(n+1) of one cycle and that the period when the clock 53-i is at the low level is (n+1-i)/(n+1) of one cycle. By presetting duty ratio information desired to be selected in the pulse width setting register 56, a clock having the desired duty ratio can be selected from the outputs 53-1 to 53-n of the frequency-dividers 52-1 to 52-n by the clock selection circuit 54. As a result, the clock having the selected pulse width is output from the pulse width variable frequency-divider 51 as the output clock 55. The output clock 55 is input into the phase comparator 11 as the reference clock. The pulse width information 57 may also be written in the pulse width setting register 56 vial a data bus in accordance with an instruction from a CPU. In this case, the pulse width of the clock 103 can be changed through software.

Figure 11:
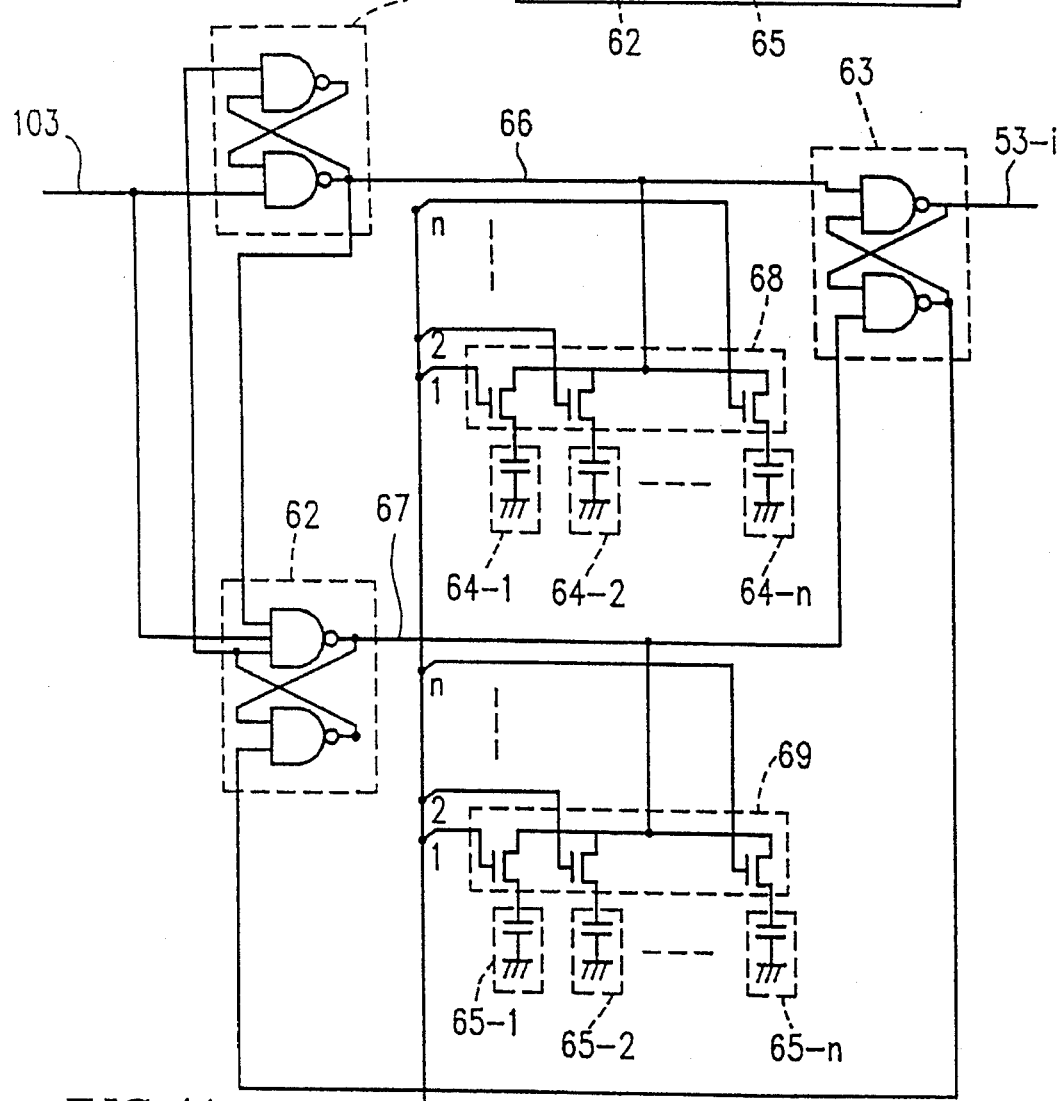
FIG. 11 is a circuit diagram of an alternative example of a pulse width variable frequency-divider 51 of the PLL circuit 3000.

FIG. 11 shows an alternative example of the pulse width variable frequency-divider 51. The pulse width variable frequency-divider 51 of this alternative example includes flipflops 61 to 63 and selection circuits 68 and 69. The selection circuit 68 selects one of capacitors 64-1 to 64-n having different capacitances from one another in accordance with the pulse width information 57. The selection circuit 69 selects one of capacitors 65-1 to 65-n having different capacitances from one another in accordance with the pulse width information 57. A capacitor 64-i selected by the selection circuit 68 is connected to an output 66 of the flipflop 61. A capacitor 65-i selected by the selection circuit 69 is connected to an output 67 of the flipflop 62. The pulse width of the output clock 55 is determined by the combination of the capacitance of the capacitor 64-i selected by the selection circuit 68 and the capacitance of the capacitor 65-i selected by the selection circuit 69.

In Example 3, the ½ frequency-divider was exemplified. It should be understood that a PLL circuit having a similar configuration to that described in this example can also be realized by using a frequency-divider having a dividing ratio other than ½. The clock having the same frequency as the base clock was used as the output clock. However, a PLL circuit having a similar configuration to that described in this example can also be realized by using an output clock having a frequency different from the base clock if a plurality of frequency-dividers are provided. The pulse width information may be supplied from outside, instead of being set inside the pulse width setting register.

Each one capacitor was selected from the capacitors 64-1 to 64-n and the capacitors 65-1 to 65-n. However, a plurality of capacitors may be selected from each of the capacitors 64-1 to 64-n and the capacitors 65-1 to 65-n as far as the above capacitance ratio is realized.

Thus, according to the PLL circuit 3000 of Example 3, the capacitances added to the outputs of the frequency-dividers are changed so as to change the pulse width of the output signal. By using this feature, it is possible to programmably change the pulse width of the clock in accordance with the pulse width information. This makes it possible to easily change the pulse width of the clock after the fabrication of the PLL circuit. As a result, the time required to re-fabricate the PLL circuit can be greatly reduced. Also, an appropriate pulse width for the clock can be easily detected,

EXAMPLE 4

A clock generator and a method for generating a clock of Example 4 utilize light in transmitting a reference clock from function blocks to a PLL circuit or distributing a clock from a PLL circuit to functional blocks.

Figure 12:
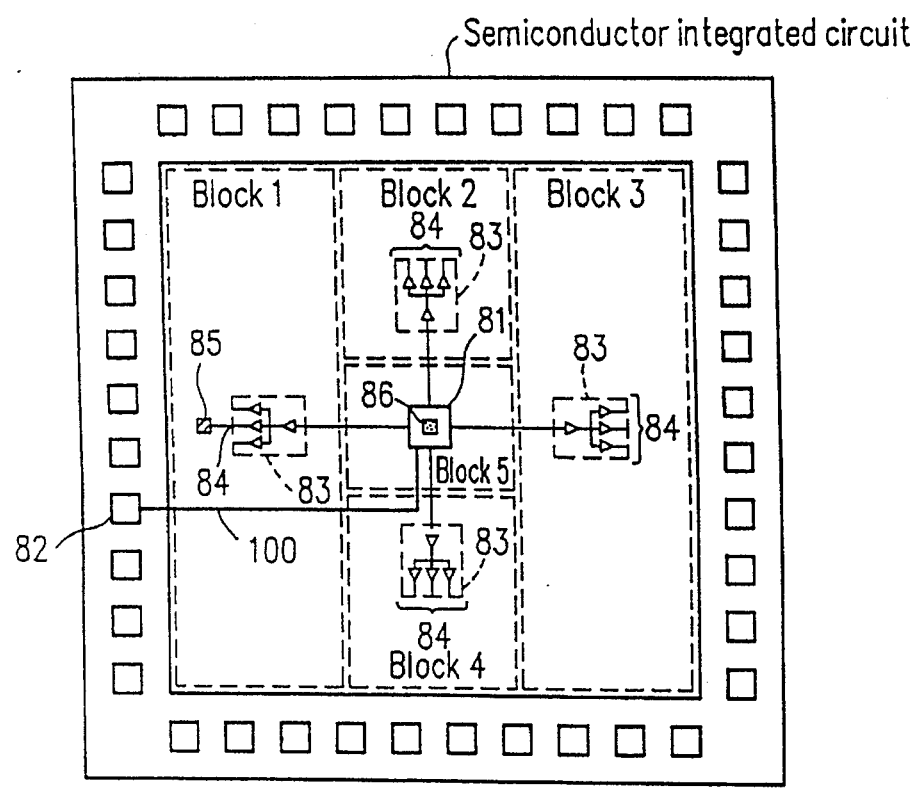
FIG. 12 is a schematic layout of a semiconductor integrated circuit including a PLL circuit 81 of a fourth example according to the present invention.

FIG. 12 shows a schematic layout of a semiconductor integrated circuit. The semiconductor integrated circuit shown in FIG. 12 includes function blocks 1 to 5. The function block 5 includes a PLL circuit 81. The PLL circuit 81 receives an external clock 100 via a clock pad 82. The PLL circuit 81 supplies a clock to the function blocks 1 to 4 in response to the external clock 100.

Each of the function blocks 1 to 4 includes a clock buffer 83 for buffering the clock output from the PLL circuit 81. The output of the clock buffer 83 is supplied inside the corresponding function block as an internal clock 84. Only the internal clock 84 of the function block 1 is connected to a light emitting element 85.

Figure 13:
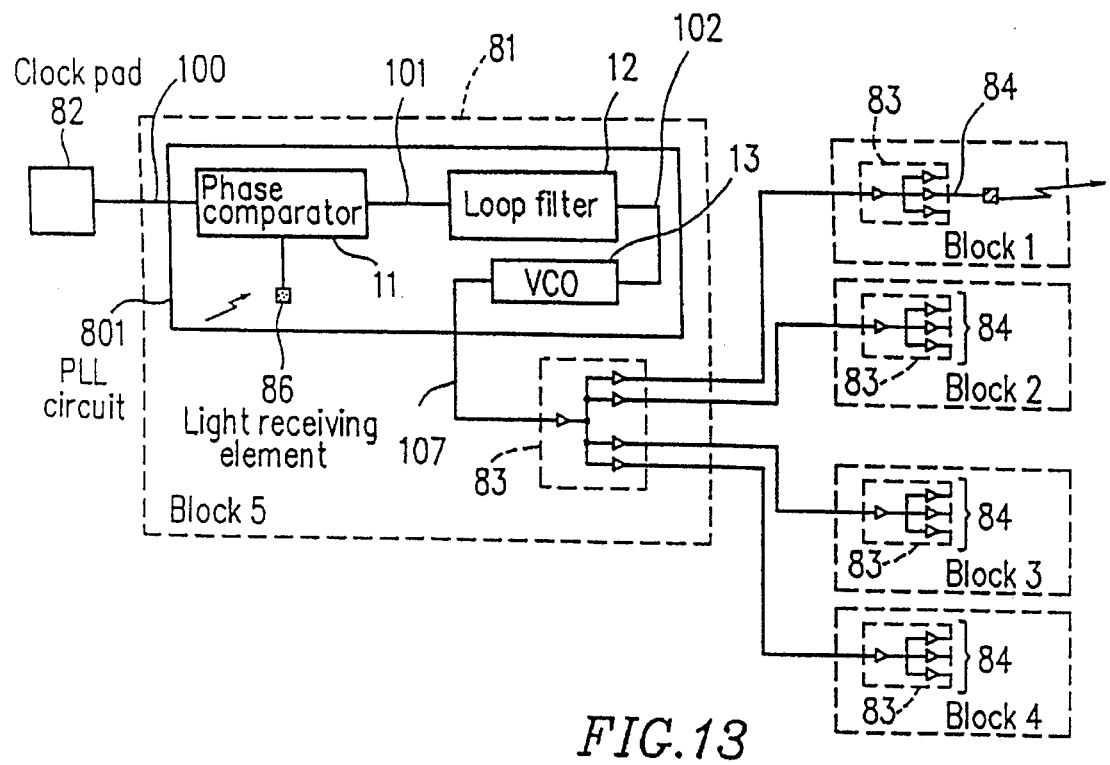
FIG. 13 is a block diagram of the PLL circuit 81.

FIG. 13 is a detailed circuit configuration of the semiconductor integrated circuit shown in FIG. 12 with the PLL circuit 81 depicted as the center.

The PLL circuit 81 includes a phase comparator 11, a loop filter 12, a voltage control oscillator 13, and a light receiving element 86. The phase comparator 11 receives a base clock 100 via a clock pad 82. The phase comparator 11 also receives an output from the light receiving element 86 as the reference clock. Thus, a feature of the PLL circuit 81 distinguished from conventional PLL circuits is that the output from the light receiving element 86 is used as the reference clock to be input into the phase comparator 11.

The phase comparator 11 detects the phase difference between the base clock 100 and the reference clock, and outputs a signal 101 indicating the detected phase difference. The loop filter 12 eliminates a harmonic component from the signal 101, and outputs a control voltage 102. The voltage control oscillator 13 outputs a frequency variable clock 107 to the clock buffer 83 of the function block 5 in correspondence with a control voltage 102 output from the loop filter 12. The clock 107 is then input into the clock buffers 83 of the function blocks 1 to 4 for the use as the internal clock inside the function blocks 1 to 4.

Figure 14:
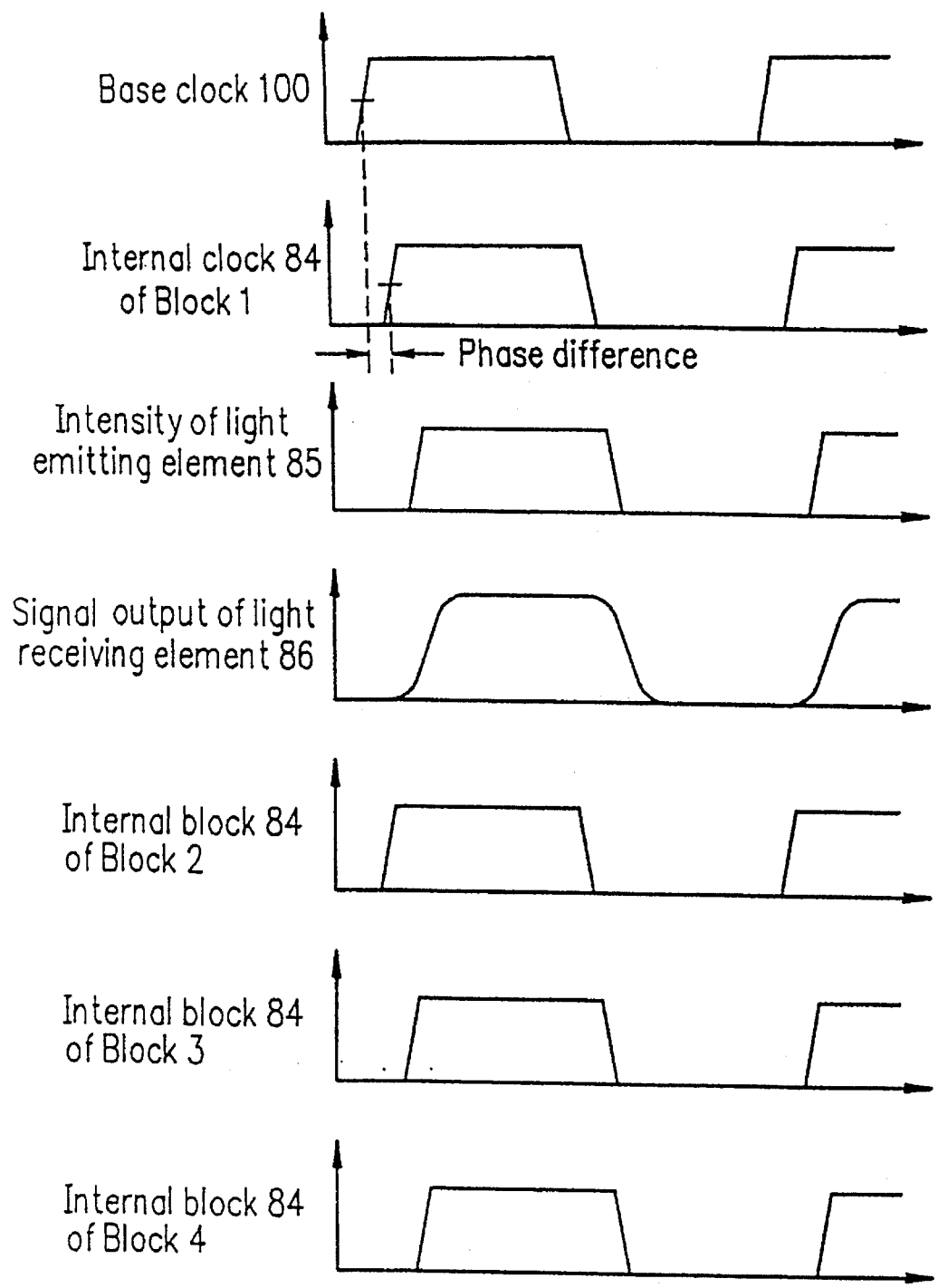
FIG. 14 is a timing chart showing the operation of the PLL circuit 81.

FIG. 14 is a timing chart showing the operation of the PLL circuit 81. The x-axes represent one identical time axis, and the y-axes represent the base clock 100, the internal clock 84 of the function block 1, the light emitting intensity of the light emitting element 85, the output of the tight receiving element 86 (reference clock), and the internal clocks 84 of the function blocks 2 to 4.

Referring to FIGS. 12 to 15, the method for transmitting the reference clock from the function blocks to the PLL circuit 81 by use of light will be described.

The light emitting element 85 is connected to the internal clock 84 output from the clock buffer 83 of the function block 1, and, as shown in FIG. 14, emits synchronously with the internal clock 84. Light emitted from the light emitting element 85 is received by the light receiving element 86. The light receiving element 86 converts the light from the light emitting element 85 into an electric signal. The converted electric signal is input into the phase comparator 11 as the reference clock. The phase difference (between the base clock 100 and the output of the light receiving element 86) detected by the phase, comparator 11 is equal to the phase difference between the base clock 100 and the internal clock 84 if the transmission delay from the light emitting element 85 to the light receiving element 86 is neglected. Accordingly, by setting this phase difference at zero, the PLL circuit 81 can supply the internal clock 84 whose phase is the same as the phase of the base clock 100 to the function block 1 having the light emitting element 85 connected thereto. Further, by using light to transmit the reference clock from the function block to the PLL circuit 81, it is possible to prevent a signal delay due to wirings which may cause an error. This makes it possible to reduce the phase difference between the external clock and the internal clock.

Figure 15:
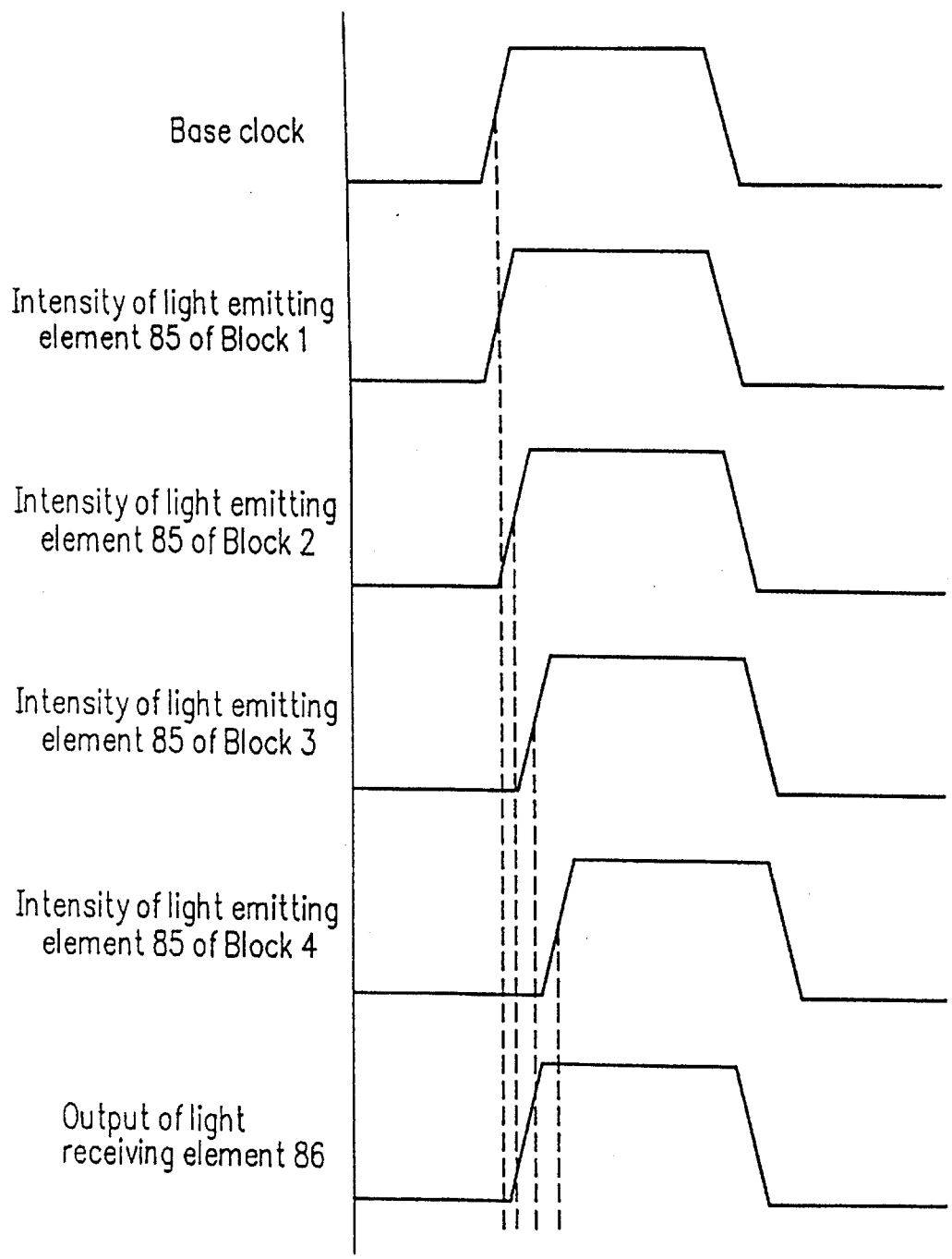
FIG. 15 is a timing chart showing the delay of internal clocks 84 of function blocks with respect to a base clock.
Figure 22:
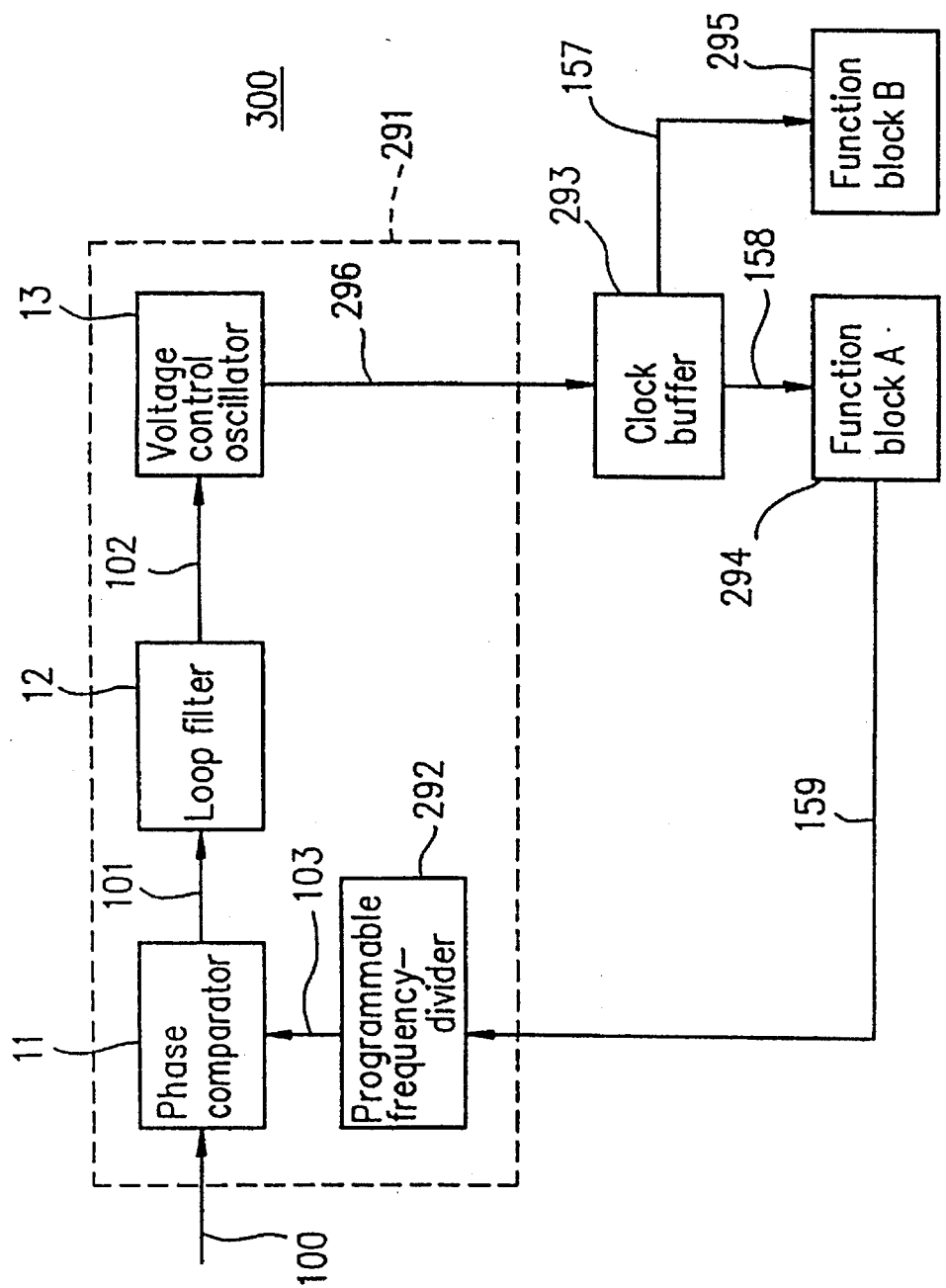
FIG. 22 is a block diagram showing a conventional PLL circuit.

As shown in FIG. 15, the delays of the internal clocks 84 of the function blocks with respect to the base clock 100 are different from one another depending on factors such as the length of wirings extending from the PLL circuit 81 to each function block and the load of the clock in each function block. Accordingly, it is preferable to connect the light emitting element to one of the internal clocks 84 that has an average delay with respect to the base clock 100. With this design, the clock skew among the function blocks can be minimized. Alternatively, the light emitting element 85 shown in FIG. 13 may be provided for each of the function blocks. In this case, the light receiving element 86 which outputs the average of the phase differences between the base clock 100 and the internal clocks 84 of the function blocks should be provided in the PLL circuit 81, so as to minimize the clock skew among the function blocks.

Figure 16:
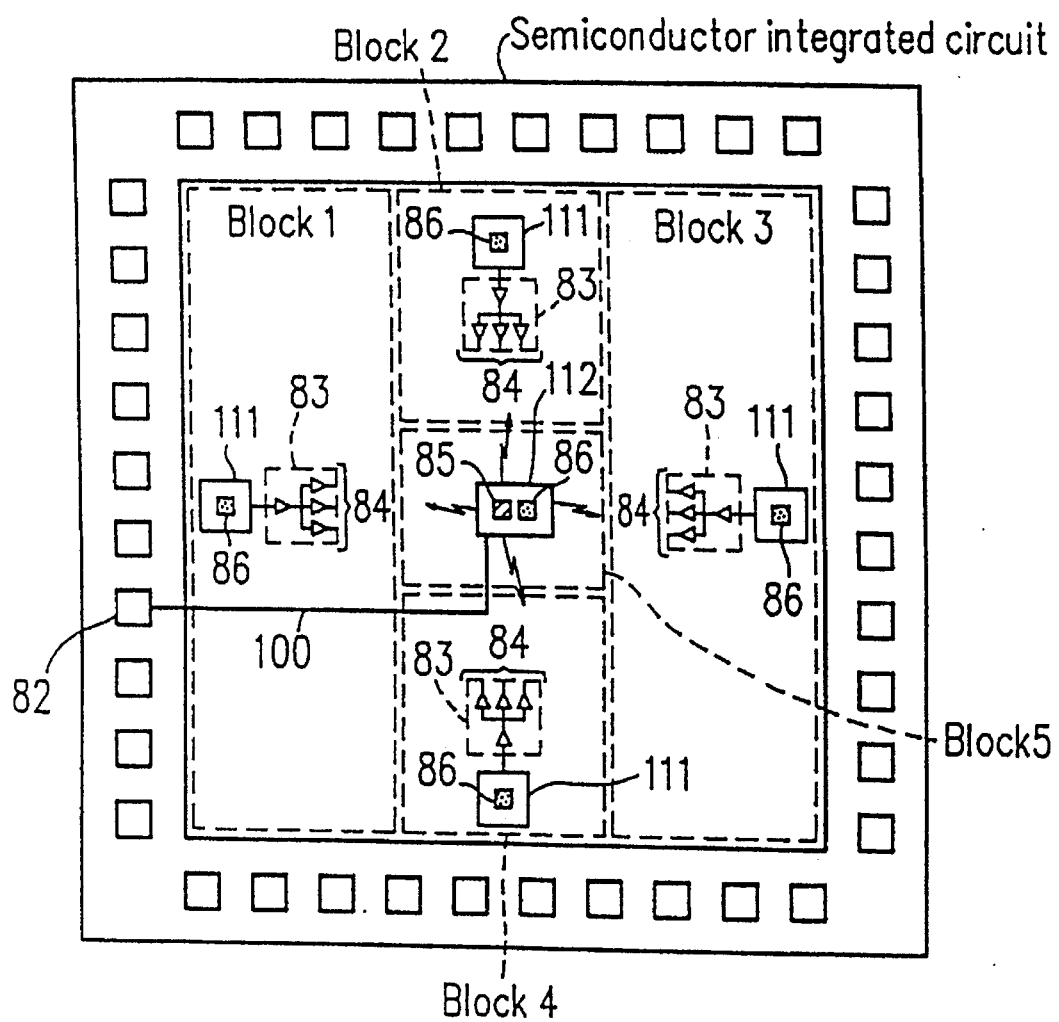
FIG. 16 is a schematic layout of a semiconductor integrated circuit including a PLL circuit 111 and a clock circuit 112 of the fourth example according to the present invention.

FIG. 16 shows a schematic layout of an alternative example of the semiconductor integrated circuit. In this alternative example, the semiconductor integrated circuit includes function blocks 1 to 5. All of the function blocks 1 to 4 have respective PLL circuits 111. Each of the PLL circuits 111 supplies an internal clock 84 inside the function block via a clock buffer 83. The function block 5 includes a clock circuit 112 which receives an external clock 100 via a clock pad 82.

Figure 17:
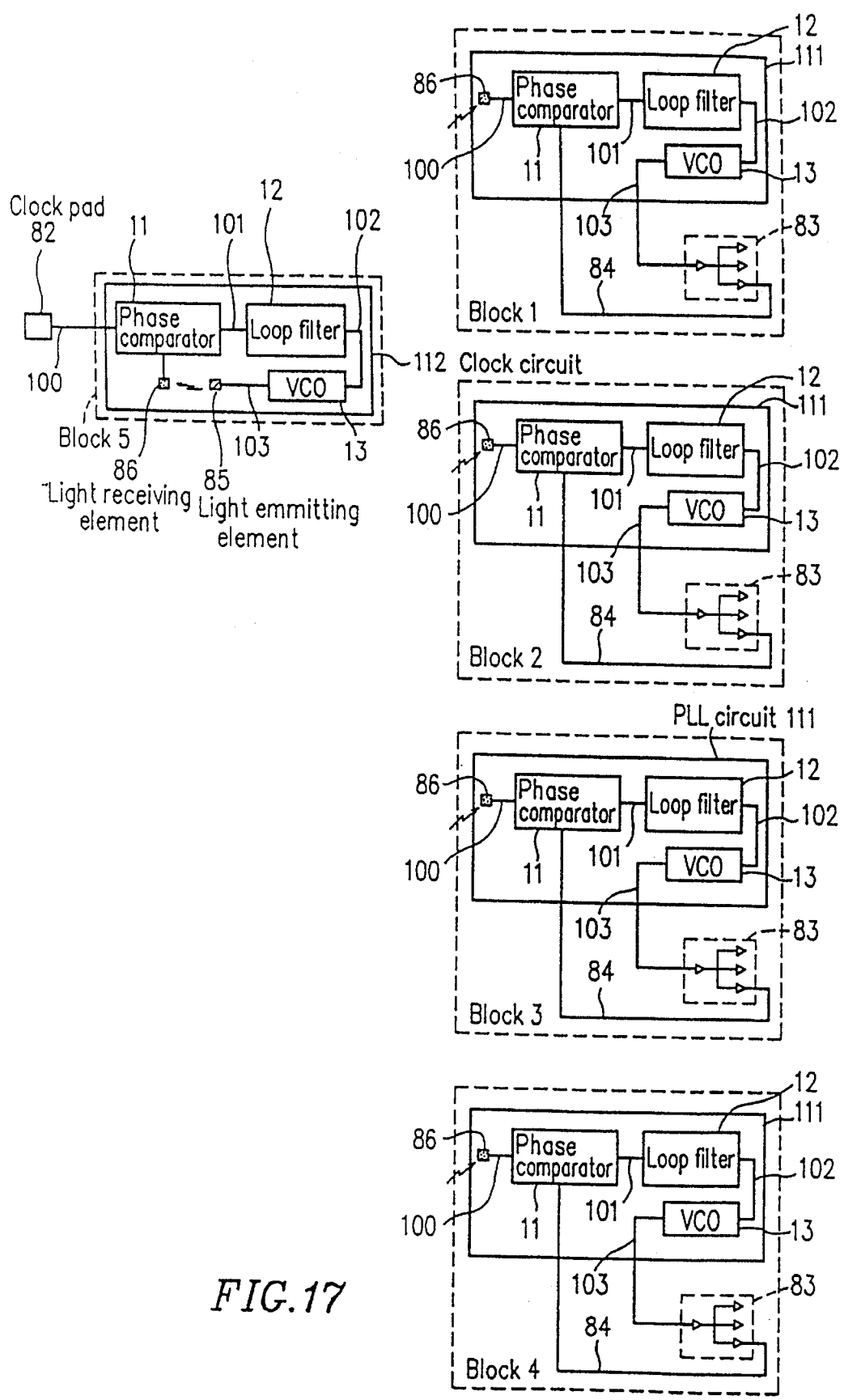
FIG. 17 is a block diagram of the PLL circuit 111 and the clock circuit 112.

FIG. 17 shows a detailed circuit configuration of the semiconductor integrated circuit shown in FIG. 16, with the PLL circuits 111 and the clock circuit 112 depicted as centers.

Each of the PLL circuit 111 includes a phase comparator 11, a loop filter 12, a voltage control oscillator 13, and a light receiving element 86. The phase comparator 11 receives an output from the light receiving element 86 as the base clock. The phase comparator 11 also receives the internal clock 84 output from the clock buffer 83 as the reference clock. Thus, a feature of the PLL circuit 111 distinguished from conventional PLL circuits is that the output from the light receiving element 86 is used as the base clock to be input into the phase comparator 11.

Each of the phase comparators 11 detects the phase difference between the base clock and the reference clock, and outputs a signal 101 indicating the detected phase difference. Each of the loop filters 12 eliminates a harmonic component from the signal 101 and outputs a control voltage 102. Each of the voltage control oscillators 13 outputs a frequency variable clock 103 to the clock buffer 83 in correspondence with the control voltage 102 output from the loop filter 12.

The clock circuit 112 includes a light emitting element 85 in addition to the configuration of the PLL circuit 111. The phase comparator 11 receives the base clock 100 via the clock pad 82. The phase comparator 11 also receives the output from the light receiving element 86 as the reference clock. The phase comparators 11 detects the phase difference between the base clock and the reference clock, and outputs a signal 101 indicating the detected phase difference. The loop filter 12 eliminates a harmonic component from the signal 101 and outputs the control voltage 102. The voltage control oscillator 13 outputs the frequency variable clock 103 to the light emitting element 85 in correspondence with the control voltage 102 output from the loop filter 12. The light emitting element 85 emits light in response to the clock 103. Thus, a feature of the clock circuit 112 distinguished from conventional PLL circuits is that the output from the light receiving element 86 is used as the reference clock to be input into the phase comparator 11 and that the output from the light emitting element 85 is connected to the output of the voltage control oscillator 13.

Figure 18:
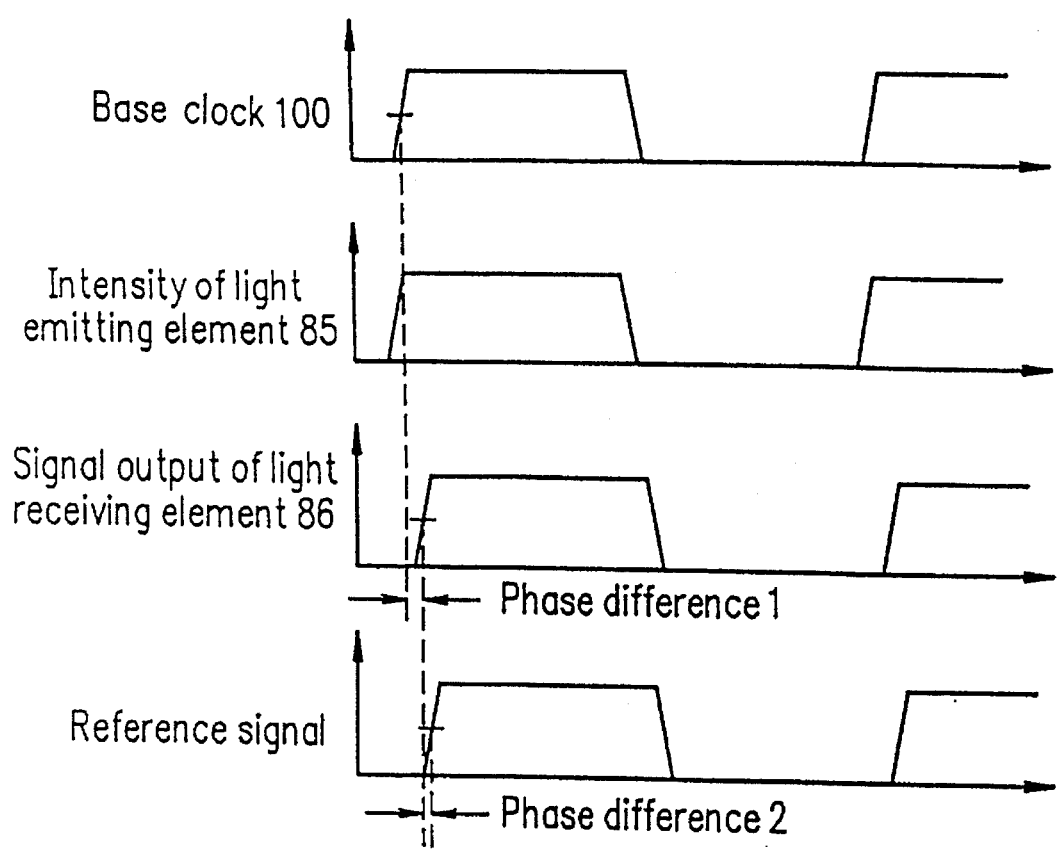
FIG. 18 is a timing chart showing the operation of the PLL circuit 111 and the clock circuit 112.

FIG. 18 is a timing chart showing the operations of the PLL circuits 111 and the clock circuit 112. The x-axes represent one identical time axis, and the y-axes represent the base clock 100, the light emitting intensity of the light emitting element 85, the output the light receiving element 86, and the reference clock.

Referring to FIGS. 16 to 18, the method for transmitting the reference clock from the PLL circuit 111 of each function block to the clock circuit 112 and distributing the clock from the clock circuit 112 to the PLL circuit 81 of each function block will be described.

First, the operation of the clock circuit 112 will be described. In the clock circuit 112, the light emitting element 85 is connected to the output of the voltage control oscillator 13, and emits light synchronously with the clock 103 output from the voltage control oscillator 13 as shown in FIG. 18. The light emitted from the light emitting element 85 is received by the light receiving element 86. The light receiving element 86 converts the light from the light emitting element 85 into an electric signal. The converted electric signal is input into the phase comparator 11 as the reference clock. The phase difference (between the base clock 100 and the output of the light receiving element 86) detected by the phase comparator 11 includes a delay from the time when an electric signal is input into the light emitting element 85 to the time when the electric signal is output from the light receiving element 86 (a phase difference i shown in FIG. 18). Accordingly, by setting this phase difference at zero, the clock circuit 112 can supply the base clock whose phase is the same as the phase of the external clock 100 to each of the function blocks 1 to 4 including the light receiving elements 86.

Next, the operation of the PLL circuit 111 provided in each function block will be described. In the PLL circuit 111, the phase comparator 11 receives the output from the light receiving element 86 as the base clock. The phase difference (between the output of the light receiving element 86 and the output of the clock buffer 83) detected by the phase comparator 11 includes a delay generated due to the time needed for the clock 103 output from the voltage control oscillator 13 to be input into the clock buffer 83 and then supplied to a logic circuit (a phase difference 2 shown in FIG. 18). Accordingly, by setting this phase difference at zero, the PLL circuit 111 can supply an internal clock whose phase is the same as %he phases of the internal clocks in other function blocks to each of the function blocks 1 to 4 which use the output from the light receiving element 86 as the base clock.

Figure 19:
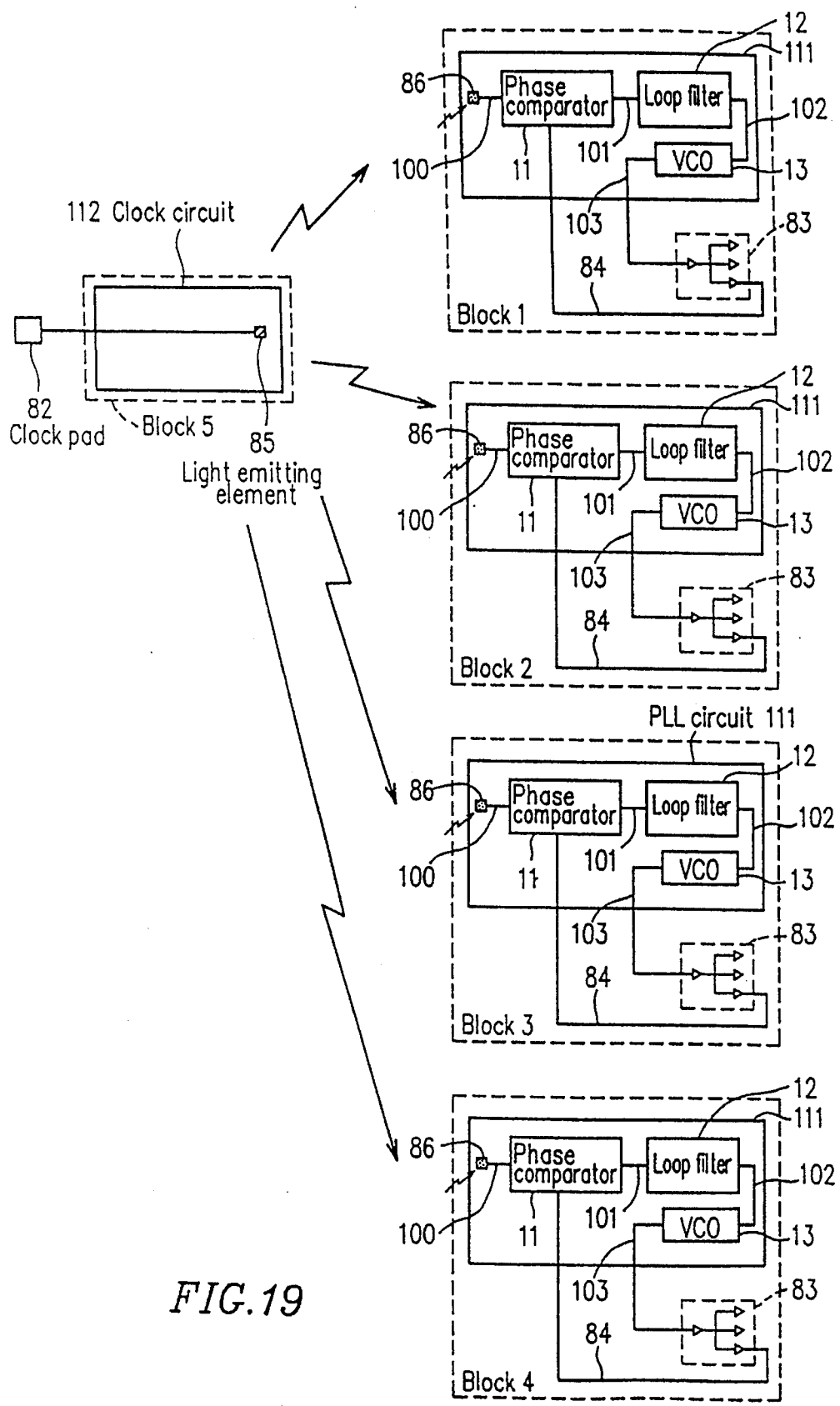
FIG. 19 is a schematic layout of another semiconductor integrated circuit including the PLL circuit 111 and the clock circuit 112 of the fourth example according to the present invention.

FIG. 19 shows a circuit configuration of another alternative example of the semiconductor integrated circuit. In this alternative example, the configuration of the clock circuit 112 shown in FIG. 17 is simplified.

Referring to FIG. 19, a clock circuit 112 includes a light emitting element 85. A base clock 100 is input into the light emitting element 85 via a clock pad 82. The light emitting element 85 emits light synchronously with the base clock 100. The light emitted from the light emitting element 85 is received by a light receiving element 86 of each function block.

The configuration and the operation of a PLL circuit 111 of each function block are the same as those described above with reference to FIG. 17. Therefore, in this alternative example, by setting the phase difference between the output of the light receiving element 86 and the output of the clock buffer 83 at zero, the PLL circuit 111 can supply an internal clock whose phase is the same as the phases of the internal clocks of other function blocks (i.e., clock skew between function blocks is zero) to each of the function blocks 1 to 4.

The configuration of the semiconductor integrated circuit shown in FIG. 19 is advantageous when the skew of the base clock (the phase difference 1 shown in FIG. 18) is negligibly small. This is because the configuration of the clock circuit 112 of this alternative example is simpler than that shown in FIG. 17.

Figure 20:
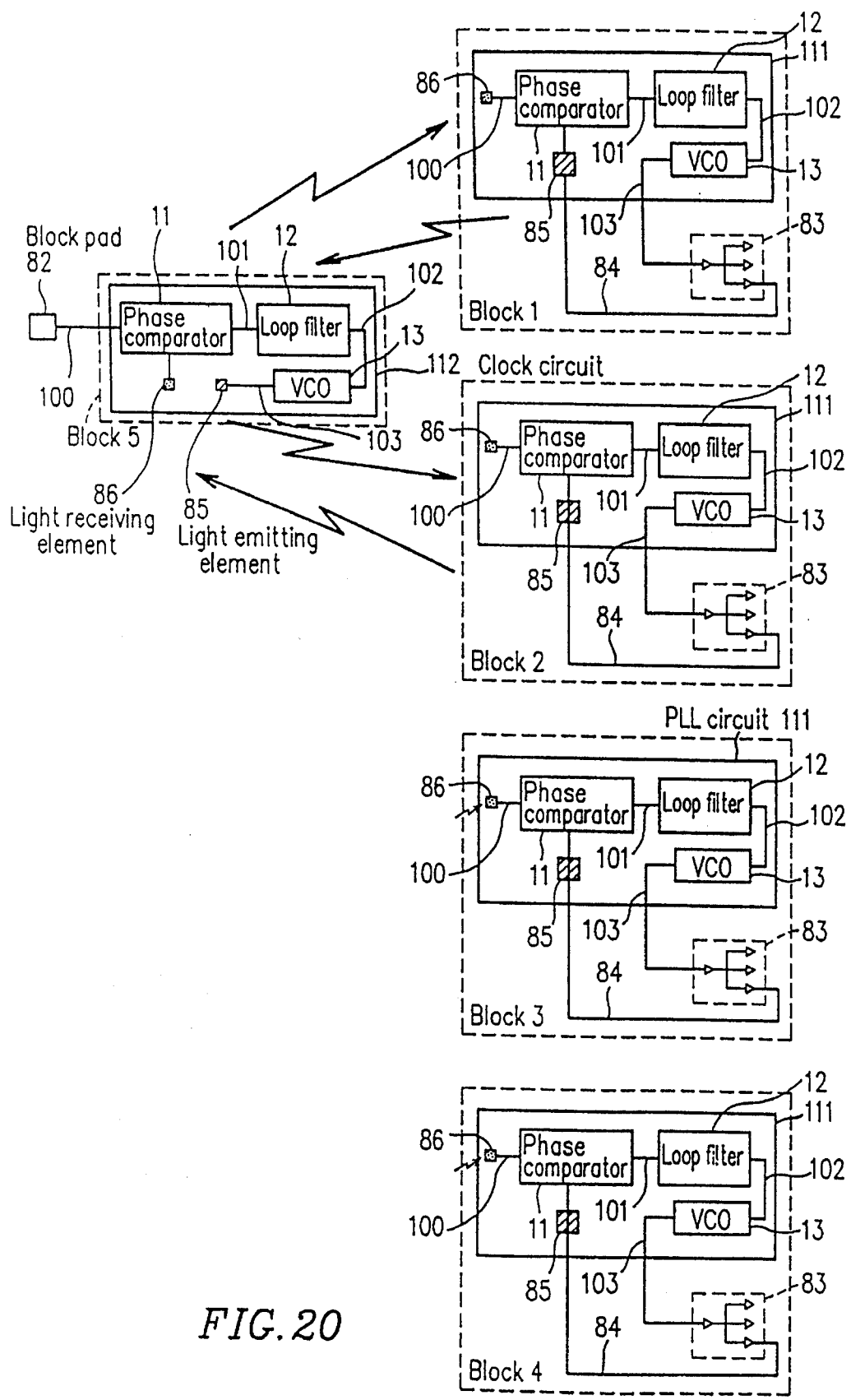
FIG. 20 is a schematic layout of still another semiconductor integrated circuit including the PLL circuit 111 and the clock circuit 112 of the fourth example according to the present invention.

FIG. 20 shows a circuit configuration of yet another alternative example of the semiconductor integrated circuit. In this alternative example, each PLL circuit 111 includes a light emitting element 85 in addition to the configuration of the PLL circuit 111 shown in FIG. 17. The clock circuit 112 has the same configuration as that of the clock circuit 112 shown in FIG. 17. Light emitted from the light emitting light element 85 of the clock circuit 112 is received by a light receiving element 86 of the PLL circuit 111 of each function block.

The PLL circuit 111 of each function block has the same configuration as that of the PLL circuit 111 shown in FIG. 17 except that the light emitting element 85 is connected to the output of a clock buffer 83. Light emitted from the light emitting element 85 of the PLL circuit 111 is received by the light receiving element 86 of the clock circuit 112.

Thus, by using light in the transmission of the reference clock and the distribution of clocks, it is possible to prevent a variation in the delay caused by the length of wirings, the load of the clock in the function blocks, and the like, and minimize the clock skew among the function blocks and the phase difference between the external clock and the internal clocks. Also, the use of light to transmit clocks (the base clock and the reference clock) eliminates the necessity of providing wirings for clocks which are required to be thick in order to prevent electro-migration. This greatly reduces the number of wirings required for the semiconductor integrated circuit and thus reduces the area of the resultant semiconductor integrated circuit. Further, since such wirings for clocks required to be tree-like are not necessary, the layout of the semiconductor integrated circuit can be designed more freely.

In Example 4, in order to simplify the description, the light emitting elements and the light receiving elements are described to be placed on the same semiconductor integrated circuit. However, in the case of a multi-chip module where a plurality of semiconductor integrated circuits are mounted in one and the same sealed package, the light receiving elements may be disposed on a plurality of boards having semiconductor integrated circuits requiring the supply of clocks mounted thereon, though the light emitting element and the light receiving element of the clock circuit 112 should be on the same semiconductor integrated circuit.

Hereinbelow, effective transmittance of light from the light emitting element 85 to the light receiving element 86 will be described.

Figure 21A:
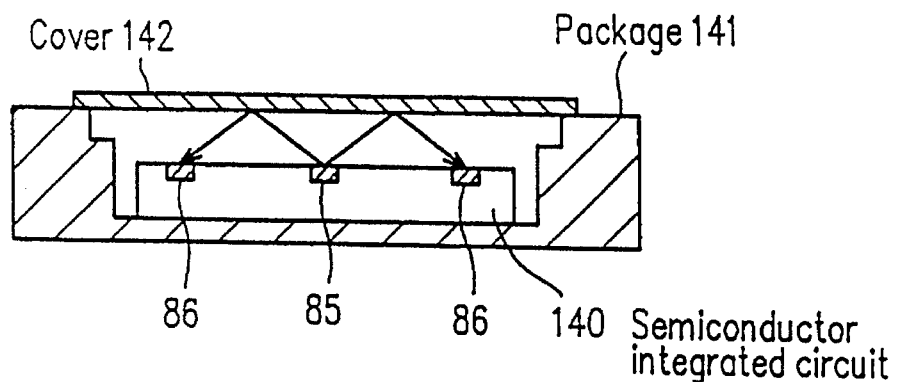
FIGS. 21A to 21C are sectional views of packages having semiconductor integrate:d circuits mounted thereon.
Figure 21B:
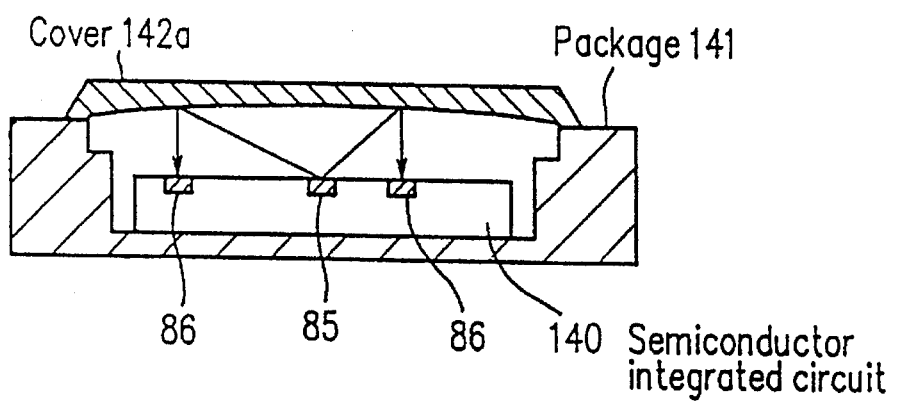
Figure 21C:
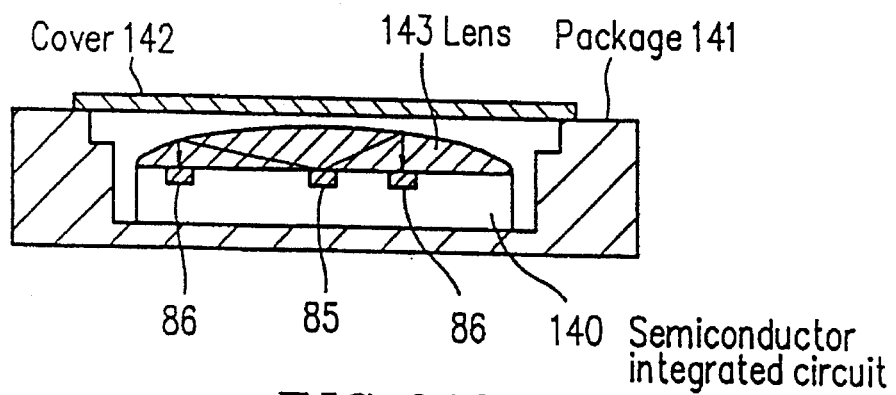

FIG. 21A to 21C show examples of a package 141 in which a semiconductor integrated circuit 140 is sealed. The semiconductor integrated circuit 140 includes a light emitting element 8S and light receiving elements 86. The light emitting element 85 is placed in the center portion of the semiconductor integrated circuit 140, while the light receiving elements 86 are placed in the peripheral portion thereof as shown in FIG. 16. The package 141 is sealed with a plate cover.

In the example shown in FIG. 21A, a mirror-polished metal plate or a plate covered with a metal thin film (for example, a ceramic plate) is used as a cover 142 of the package 141. Light emitted from the light emitting element 85 reaches the light receiving elements 86 after being reflected by the cover 142. This is the simplest way to efficiently transmit light from the light emitting element 85 to the light receiving elements 86.

In the example shown in FIG. 21B, the back surface of a cover 142a of the package 141 has an optical characteristic which allows light to scatter from the center portion of the semiconductor integrated circuit 140 to the peripheral portion thereof. With this arrangement, light emitted from the light emitting element 85 reaches the light receiving elements 86 more efficiently than in the example shown in FIG. 21A. This is because the light emitting element 85 is disposed in the center portion of the semiconductor integrated circuit 140, while the light receiving elements 86 is disposed in the peripheral portion thereof.

In the example shown in FIG. 21C, a lens 143 having an optical characteristic which allows light to scatter from the center portion of the semiconductor integrated circuit 140 to the peripheral portion thereof is formed on the semiconductor integrated circuit 140, instead of the cover 142a. The lens 143 is made of glass or resin transparent against a wavelength required for light transmission. The surface of the lens 143 which is not in contact with the semiconductor integrated circuit 140 is covered with a metal thin film. With this arrangement, light emitted from the light emitting element 85 reaches the light receiving element 86 more efficiently than in the example shown in FIG. 21A.

By using the cover 142 or 142a of the package 141 or placing the lens 143 on the semiconductor integrated circuit 140 as described above, it is possible to transmit a signal by use of a reduced Mount of light output. This reduces power consumption of the semiconductor integrated circuit on which the light emitting element is mounted. Heat generation can also be reduced by reducing power consumption. In the illustrated examples, in order to simplify the description, the configuration where the light emitting element and the light receiving elements are placed on the same semiconductor integrated circuit was used. The same effect can be obtained for the multichip module where a plurality of semiconductor integrated circuits are mounted in the same package. Also, in the illustrated examples, the light emitting element 85 is disposed in the center portion of the semiconductor integrated circuit 140, while the light receiving elements 86 are disposed on the peripheral portion thereof. It will be understood that the same effect can be obtained by disposing the light receiving element 86 on the center portion of the semiconductor integrated circuit 140, while disposing the light emitting element 85 on the peripheral portion thereof.

Thus, according to the clock generator and the method for generating a clock of the present invention, the control voltage of the voltage control oscillator 13 is controlled in response to the reset signal so as to prevent the voltage control oscillator 13 from oscillating. Simultaneously, the phase difference between two signals input into the phase comparator 11 is made zero. This allows the PLL circuit to be halted without generating a DC path. As a result, power consumption of the PLL circuit can be greatly reduced.

Also, when the phase difference between the base clock 100 and the reference clock 103 exceeds a predetermined threshold value, the compulsory lock circuit 21 is activated. This makes it possible for the PLL circuit to resume the lock state more promptly than in the case of utilizing the feedback characteristic of the PLL circuit. As a result, the function blocks connected to the PLL circuit can continue the operation without lowering the performance thereof.

Moreover, the frequency pulling process at the activation of the system can be omitted. This reduces the setup time required for the activation of the system.

Furthermore, it is possible to change the pulse width of a clock programmably in correspondence with pulse width information. This makes it possible to easily change the pulse width of the clock after the fabrication of the PLL circuit. As a result, the time required for re-fabricating the PLL circuit can be greatly reduced. Also, an appropriate pulse width of the clock can be easily detected.

Moreover, the reference clock can be transmitted by use of light. By this use of light, the phase difference between the external clock and the internal clock can be made zero. The base clock can also be transmitted by use of light. By this use of light, the phase difference among the internal clocks of a plurality of function blocks can be made zero.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A clock generator comprising:

input shutoff control means for receiving a base clock and a reference clock and outputting a first signal and a second signal in response to a reset signal;

phase comparison means for outputting a phase difference signal indicating a phase difference between the first signal and the second signal;

voltage control oscillation means for outputting a frequency variable clock in correspondence with the phase difference signal; and voltage fixing control means for controlling a voltage of the phase difference signal in response to the reset signal, wherein, when the reset signal is in a first level, the input shutoff control means outputs the base clock to the phase comparison means as the first signal and outputs the reference clock to the phase comparison means as the second signal, and the voltage fixing control means holds the voltage of the phase difference signal, and when the reset signal is in a second level different from the first level, the input shutoff control means outputs two signals to the phase comparison means as the first signal and the second signal, the phase difference between the two signals being substantially zero, and the voltage fixing control means fixing the voltage of the phase difference signal to a predetermined voltage at which the voltage control oscillation means does not oscillate.

2. An apparatus comprising detection means for outputting a reset signal in response to a predetermined condition, a clock generator for generating a clock, and a circuit portion operating in correspondence with the clock, the clock generator including:

input shutoff control means for receiving a base clock and a reference clock end outputting a first signal and a second signal in response to a reset signal;

phase comparison means for outputting a phase difference signal indicating a phase difference between the first signal and the second signal;

voltage control oscillation means for outputting a frequency variable clock in correspondence with the phase difference signal; and voltage fixing control means for controlling a voltage of the phase difference signal in response to the reset signal, wherein, when the reset signal is in a first level, the input shutoff control means outputs the base clock to the phase comparison means as the first signal and outputs the reference clock to the phase comparison means as the second signal, and the voltage fixing control means holds the voltage of the phase difference signal, and when the reset signal is in a second level different from the first level, the input shutoff control means outputs two signals to the phase comparison means as the first signal and the second signal, the phase difference between the two signals being substantially zero, and the voltage fixing control means fixes the voltage of the phase difference signal to a predetermined voltage at which the voltage control oscillation means does not oscillate.

3. A method for generating a clock by use of an apparatus including phase comparison means for receiving a base clock and a reference clock and outputting a phase difference signal indicating a phase difference between the base clock and a reference clock, and voltage control oscillation means for outputting a frequency variable clock in correspondence with the phase difference signal, the method comprising the steps of:

making the phase difference between the base clock and the reference clock substantially zero in response to a reset signal; and fixing a voltage of the phase difference signal to a predetermined voltage at which the voltage control oscillation means does not oscillate in response to a reset signal.

4. A clock generator comprising:

phase comparison means for receiving a base clock and a reference clock and outputting a phase difference signal indicating a phase difference between the base clock and a reference clock;

voltage control oscillation means connected to an output of the phase comparison means via first switching means for outputting a frequency variable clock in correspondence with the phase difference signal;

constant voltage supply means connected to an input of the voltage control oscillation means via second switching means and connected to the output of the phase comparison means via third switching means for supplying a constant voltage substantially equal to the output of the phase comparison means in a lock state;

constant voltage means connected to the output of the phase comparison means via fourth switching means for fixing the output of the phase comparison means to a predetermined voltage;

determination means for determining whether or not the phase difference signal exceeds a predetermined threshold value; and control means for controlling ON/OFF of the first switching means through the fourth switching means in correspondence with a result of the determination by the determination means.

5. A clock generator according to claim 4, wherein, when determination means determined that the phase difference signal exceeds the predetermined threshold value, the control means:

sets the first switching means OFF while it sets the second switching means ON during a first period having a length corresponding to the phase difference signal;

sets the third switching means ON during a second period included in the first period; and sets the fourth switching means ON during a third period included in the first period and succeeding the second period.

6. A method for generating a clock by use of an apparatus including a phase comparison means for receiving a base clock and a reference clock and outputting a phase difference signal indicating a phase difference between the base clock and the reference clock, and a voltage control oscillation means for outputting a frequency variable clock in correspondence with the phase difference signal, the method comprising the steps of:

determining whether or not the phase difference signal exceeds a predetermined threshold value;

supplying a constant voltage substantially equal to the output of the phase comparison means in a lock state to the input of the voltage control oscillation means during a first period having a length corresponding to the phase difference signal in correspondence with a result of the determination;

fixing the output of the phase comparison means to a predetermined voltage during a second period included in the first period in correspondence with the result of the determination; and supplying a constant voltage substantially equal to the output of the phase comparison means in the lock state to the output of the phase comparison means during a third period included in the first period and succeeding to the second period in correspondence with the result of the determination.

7. A clock generator comprising:

phase comparison means for receiving a base clock and a reference clock and outputting a phase difference signal indicating a phase difference between the base clock and a reference clock;

voltage control oscillation means connected to an output of the phase comparison means via first switching means for outputting a frequency variable clock in correspondence with the phase difference signal;

constant voltage supply means, connected to an input of the voltage control oscillation means via second switching means and connected to the output of the phase comparison means via third switching means, for supplying a constant voltage substantially equal to the output of the phase comparison means in a lock state;

constant voltage means connected to the output of the phase comparison means via fourth switching means for fixing the output of the phase comparison means to a predetermined voltage;

means for receiving a lock indication signal; and control means for controlling ON/OFF of the first switching means through the fourth switching means in correspondence with the lock indication signal.

8. A clock generator according to claim 7, wherein the control means:

sets the first switching means OFF while it sets the second switching means ON during a first period having a length corresponding to the phase difference signal in correspondence with the lock indication signal;

sets the third switching means ON during a second period included in the first period in correspondence with the lock indication signal; and sets the fourth switching means ON during a third period included in the first period and succeeding the second period in correspondence with the lock indication signal.

9. A method for generating a clock by use of an apparatus including a phase comparison means for receiving a base clock and a reference clock and outputting a phase difference signal indicating a phase difference between the base clock and the reference clock and a voltage control oscillation means for outputting a frequency variable clock in correspondence with the phase difference signal, the method comprising the steps of:

supplying a constant voltage substantially equal to an output of the phase comparison means in a lock state to the voltage control oscillation means during a first period having a length corresponding to the phase difference signal in correspondence with the lock indication signal;

fixing the output of the phase comparison means to a predetermined voltage during a second period included in the first period in correspondence with the lock indication signal; and supplying a constant voltage substantially equal to the output of the phase comparison means in the lock state to the output of the phase comparison means during a third period included in the first period and succeeding the second period in correspondence with the lock indication signal.

10. A clock generator comprising:

phase comparison means for receiving a base clock and a reference clock and outputting a phase difference signal indicating a phase difference between the base clock and the reference clock;

voltage control oscillation means for outputting a frequency variable clock in correspondence with the phase difference signal; and pulse width variable frequency division means for frequency-dividing the clock output from the voltage control oscillation means by a predetermined magnification, the frequency division means determining a pulse width of an output of the frequency division means in correspondence with pulse width information.

11. A clock generator according to claim 10, wherein the pulse width variable frequency division means includes:

a plurality of frequency division means for receiving the clock output from the voltage control oscillation means and outputting clocks having pulse widths different from one another; and selection means for selecting at least one of the outputs of the plurality of frequency division means in correspondence with the pulse width information.

12. A clock generator according to claim 10, wherein the pulse width variable frequency division means includes means for changing a capacitance added to at least one internal signal in correspondence with the pulse width information.

13. A clock generator according to claim 10, further comprising storage means for storing the pulse width information, wherein the pulse width information is rewritten in accordance with an instruction of a CPU.

14. A clock generator comprising a PLL circuit and a light emitting element for emitting light in response to a clock, the PLL circuit including:

phase comparison means for receiving a base clock and a reference clock and outputting a phase difference signal indicating a phase difference between the base clock and the reference clock;

voltage control oscillation means for outputting a frequency variable clock in correspondence with the phase difference signal; and a light receiving element connected to the phase comparison means for converting light into an electric signal, wherein the light emitting element is connected to an output of the voltage control oscillation means via a clock buffer, light emitted from the light emitting element is input into the light receiving element, and an output of the light receiving element is supplied to the phase comparison means as the reference clock.

15. A clock generator according to claim 14, further comprising at least one light emitting element for emitting light in response to a clock, wherein the at least one light emitting element is connected to the output of the voltage control oscillation means via the clock buffer, light emitted from the at least one light emitting element is input into the light receiving element, and the light receiving element outputs an average of a first output corresponding to the light from the light emitting element and a second output corresponding to the light from the at least one light emitting element to supply the average to the phase comparison means.

16. A clock generator according to claim 14, wherein the light emitting element and the light receiving element are formed on a same semiconductor integrated circuit board.

17. A clock generator according to claim 14, wherein each of the light emitting element and the light receiving element are formed on any of a plurality of semiconductor integrated circuit boards mounted in a sealed package.

18. A clock generator according to claim 14, wherein the light emitting element is formed on the semiconductor integrated circuit board disposed in the center portion of the sealed package among the plurality of semiconductor integrated circuit boards mounted in the sealed package.

19. A clock generator comprising a clock circuit and a PLL circuit, the clock circuit including:

first phase comparison means for receiving a first base clock and a first reference clock and outputting a first phase difference signal indicating a phase difference between the first base clock and the first reference clock;

first voltage control oscillation means for outputting a first frequency variable clock in correspondence with the first phase difference signal;

a light emitting element connected to the first voltage control oscillation means for emitting light in correspondence with the first clock output from the first voltage control oscillation means; and a first light receiving element connected to the first phase comparison means for converting light into an electric signal, the PLL circuit including:

second phase comparison means for receiving a second base clock and a second reference clock and outputting a second phase difference signal indicating a phase difference between the second base clock and the second reference clock;

second voltage control oscillation means for outputting a second frequency variable clock in correspondence with the second phase difference signal; and a second light receiving element connected to the second phase comparison means for converting light into an electric signal, wherein light emitted from the light emitting element is input into the first light receiving element and the second light receiving element, the output of the first light receiving element is supplied to the first phase comparison means as the first reference clock, and the output of the second light receiving element is supplied to the second phase comparison means as the second base clock.

20. A clock generator comprising a clock circuit and a PLL circuit, the clock circuit including:

a light emitting element for receiving a first base clock and emitting light in correspondence with the first base clock, the PLL circuit including:

phase comparison means for receiving a second base clock and a reference clock and outputting a phase difference signal indicating a phase difference between the second base clock and the reference clock;

voltage control oscillation means for outputting a frequency variable clock in correspondence with the phase difference signal; and a light receiving element connected to the phase comparison means for converting light into an electric signal, wherein light emitted from the light emitting element is input into the light receiving element, and the output of the light receiving element is supplied to the phase comparison means as the second base clock.

21. A clock generator comprising a clock circuit and a PLL circuit, the clock circuit including:

first phase comparison means for receiving a first base clock and a first reference clock and outputting a first phase difference signal indicating a phase difference between the first base clock and the first reference clock;

first voltage control oscillation means for outputting a first frequency variable clock in correspondence with the first phase difference signal;

a first light emitting element connected to the first voltage control oscillation means for emitting light in correspondence with the first clock output from the first voltage control oscillation means; and a first light receiving element connected to the first phase comparison means for converting light into an electric signal, the PLL circuit including:

second phase comparison means for receiving a second base clock and a second reference clock and outputting a second phase difference signal indicating a phase difference between the second base clock and the second reference clock;

second voltage control oscillation means for outputting a second frequency variable clock in correspondence with the second phase difference signal;

a second light emitting element connected to an output of the second voltage control oscillation means via a clock buffer for emitting light in response to an output of the clock buffer; end a second light receiving element connected to the second phase comparison means for converting light into an electric signal, wherein light emitted from the first light emitting element is input into the second light receiving element, light emitted from the second light emitting element is input into the first light receiving element, an output of the first light receiving element is supplied to the first phase comparison means as the first reference clock, and the output of the second light receiving element is supplied to the second phase comparison means as the second base clock.

22. A method for generating a clock by use of a PLL circuit for receiving a base clock and a reference clock and outputting an output clock in response to the base clock and a light emitting element connected to the output clock via a clock buffer for emitting light in response to an output of the clock buffer, the method comprising the step of:

transmitting the output of the clock buffer to the PLL circuit as the reference clock by use of the light emitted from the light emitting element.

23. A method for generating a clock by use of a light emitting element for emitting light in response to an external clock and a PLL circuit for receiving a base clock and a reference clock and outputting an output clock in response to the base clock, the method comprising the step of:

transmitting the external clock to the PLL circuit as the base clock by use of the light emitted from the light emitting element.

\* \* \* \* \*